(12) United States Patent
Huang et al.

(10) Patent No.: US 12,477,766 B2
(45) Date of Patent: Nov. 18, 2025

(54) SEMICONDUCTOR TRANSISTOR DEVICE STRUCTURE INCLUDING NANOSTRUCTURE AND GATE STRUCTURE WITH PROTECTION LAYER AND FILL LAYER AND METHOD FOR FORMING THE SAME

(71) Applicant: Taiwan Semiconductor Manufacturing Company, Ltd., Hsinchu (TW)

(72) Inventors: Mao-Lin Huang, Hsinchu (TW); Lung-Kun Chu, New Taipei (TW); Chung-Wei Hsu, Hsinchu County (TW); Jia-Ni Yu, New Taipei (TW); Chun-Fu Lu, Hsinchu (TW); Kuo-Cheng Chiang, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/769,168

(22) Filed: Jul. 10, 2024

(65) Prior Publication Data

US 2024/0363732 A1 Oct. 31, 2024

Related U.S. Application Data

(63) Continuation of application No. 18/068,388, filed on Dec. 19, 2022, now Pat. No. 12,119,391, which is a
(Continued)

(51) Int. Cl.
*H10D 30/01* (2025.01)
*H10D 62/10* (2025.01)
(Continued)

(52) U.S. Cl.
CPC ......... *H10D 30/024* (2025.01); *H10D 62/121* (2025.01); *H10D 84/0158* (2025.01); *H10D 84/038* (2025.01)

(58) Field of Classification Search
CPC ............... H10D 30/024; H10D 62/121; H10D 84/0158; H10D 84/038; H10D 30/6757;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 108447826 A 8/2018
KR 10-2019-0143427 A 12/2019
KR 10-2020-0135724 A 12/2020

*Primary Examiner* — Changhyun Yi
(74) *Attorney, Agent, or Firm* — Birch, Stewart, Kolasch & Birch, LLP

(57) ABSTRACT

A semiconductor device structure is provided. The semiconductor device structure includes a gate structure formed over nanostructures. The gate structure includes a gate dielectric layer, and a fill layer over the gate dielectric layer. The semiconductor device structure includes a protection layer formed over the fill layer, and a gate spacer layer formed adjacent to the gate structure. The semiconductor device structure includes an insulating layer formed over the protection layer, and the insulating layer is in direct contact with the gate spacer layer.

20 Claims, 32 Drawing Sheets

Related U.S. Application Data continuation of application No. 17/227,057, filed on Apr. 9, 2021, now Pat. No. 11,563,109.

(60) Provisional application No. 63/151,195, filed on Feb. 19, 2021.

(51) Int. Cl.
*H10D 84/01* (2025.01)
*H10D 84/03* (2025.01)

(58) Field of Classification Search
CPC ............ H10D 30/6735; H10D 64/518; H10D 30/014; H10D 30/43; H10D 64/512
See application file for complete search history.

(56) References Cited

U.S. PATENT DOCUMENTS

| | | |
|---|---|---|
| 9,263,446 B1 | 2/2016 | Xie et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,818,802 B2 * | 10/2020 | Lee ...................... H10D 64/017 |
| 11,563,109 B2 | 1/2023 | Huang et al. |
| 12,119,391 B2 * | 10/2024 | Huang ................... H10D 64/01 |
| 2011/0291197 A1 * | 12/2011 | Wu ................... H10D 84/0186 257/E27.06 |
| 2014/0110778 A1 | 4/2014 | Fumitake |
| 2015/0145057 A1 | 5/2015 | Fan et al. |
| 2015/0325575 A1 | 11/2015 | Park et al. |
| 2017/0117190 A1 | 4/2017 | Chung et al. |
| 2017/0186743 A1 | 6/2017 | Chiou et al. |
| 2017/0250291 A1 | 8/2017 | Lee et al. |
| 2019/0237559 A1 * | 8/2019 | Cheng .................. H10D 30/031 |
| 2020/0373206 A1 | 11/2020 | Cheng et al. |
| 2020/0402795 A1 | 12/2020 | Chi et al. |
| 2020/0411387 A1 | 12/2020 | Chiang et al. |
| 2021/0210613 A1 * | 7/2021 | Cho .................... H10D 64/021 |
| 2022/0069101 A1 * | 3/2022 | Choi ................... H10D 30/014 |

* cited by examiner

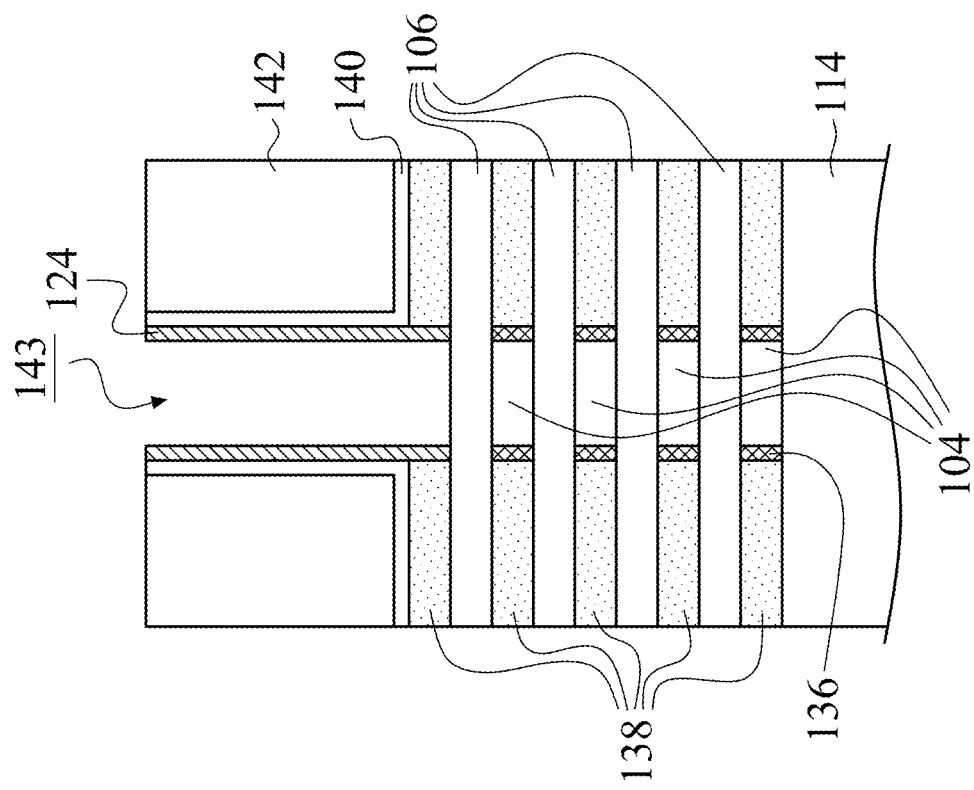
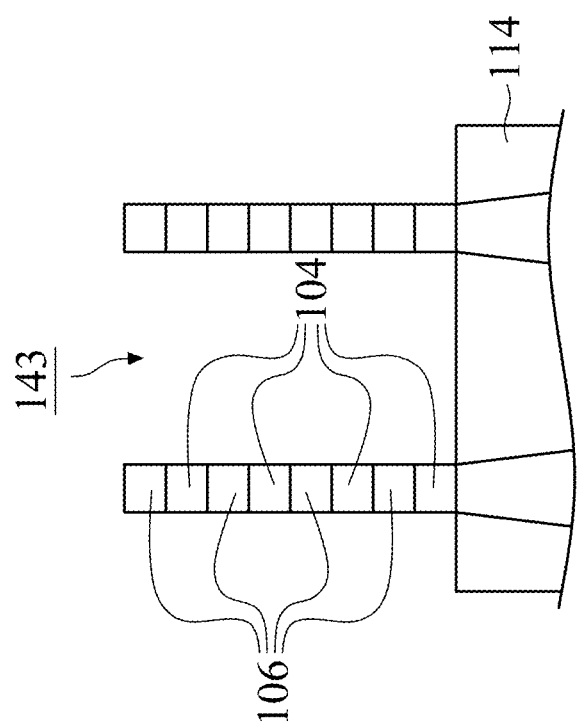
FIG. 2B
FIG. 2A

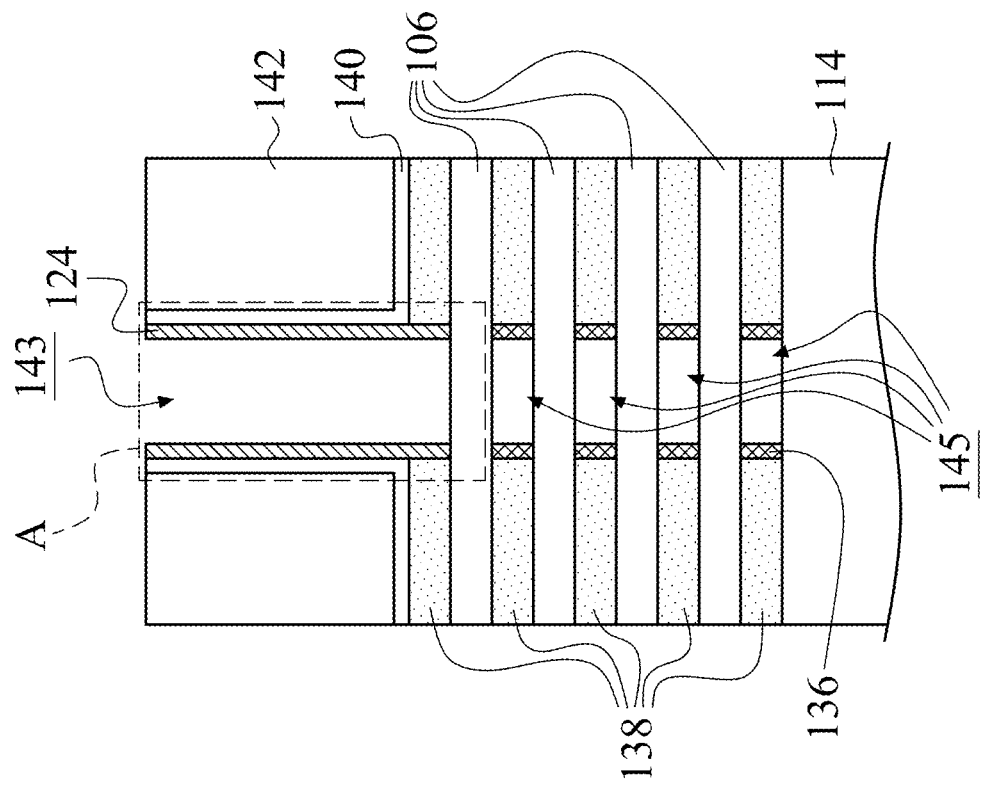
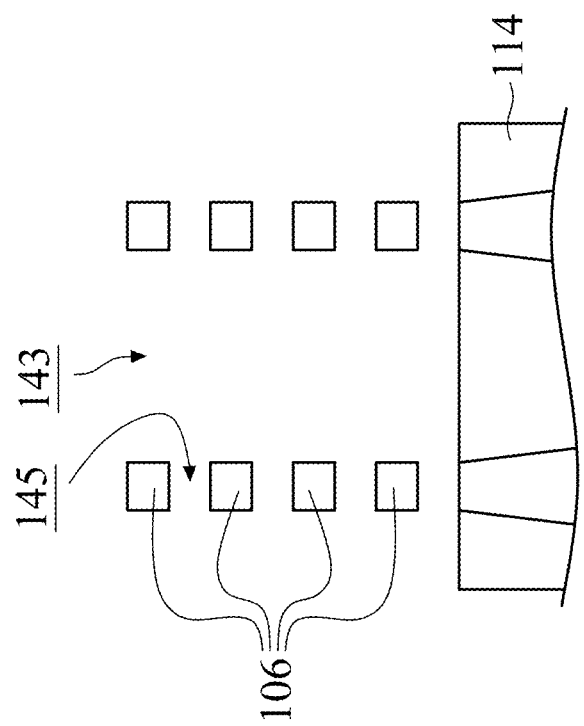
FIG. 3B
FIG. 3A

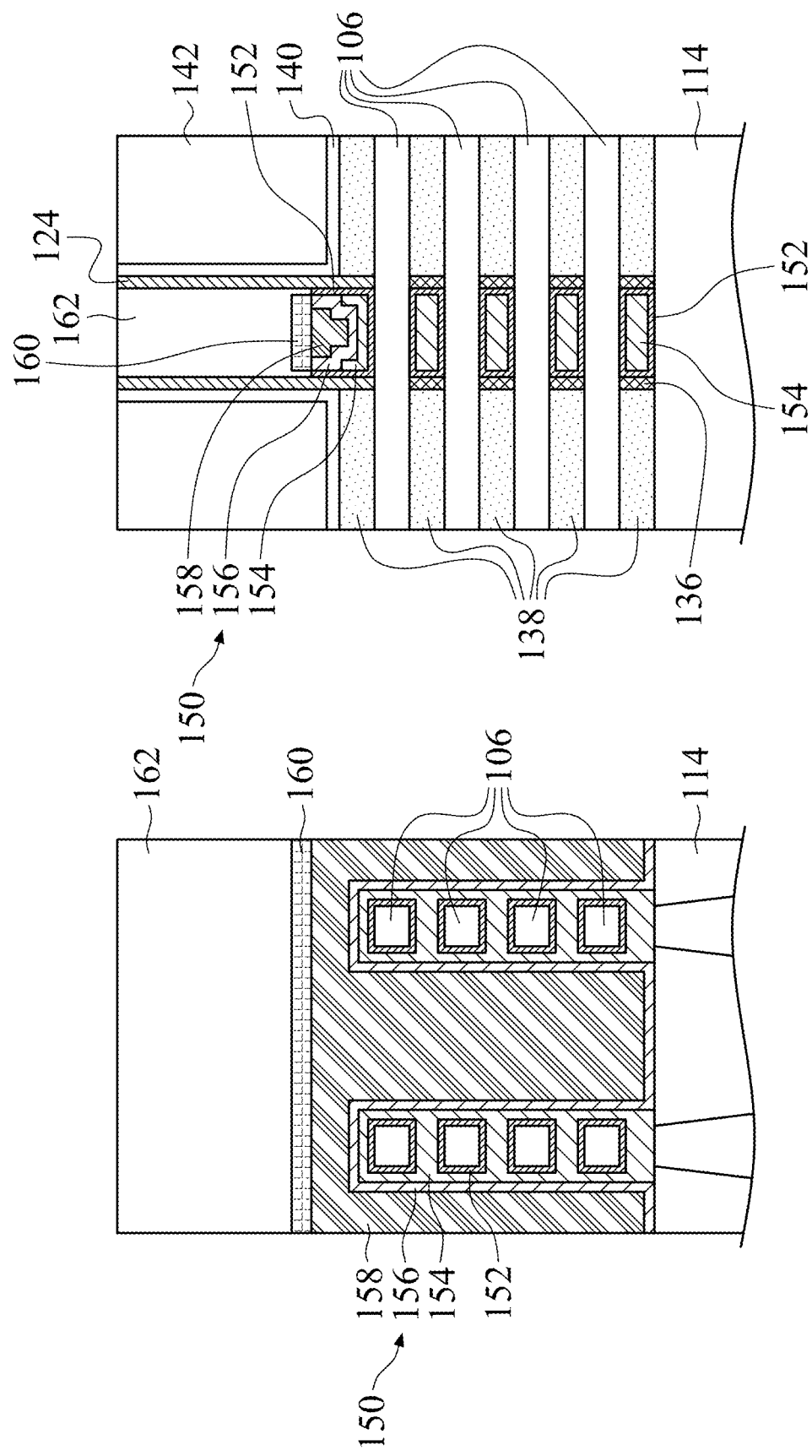

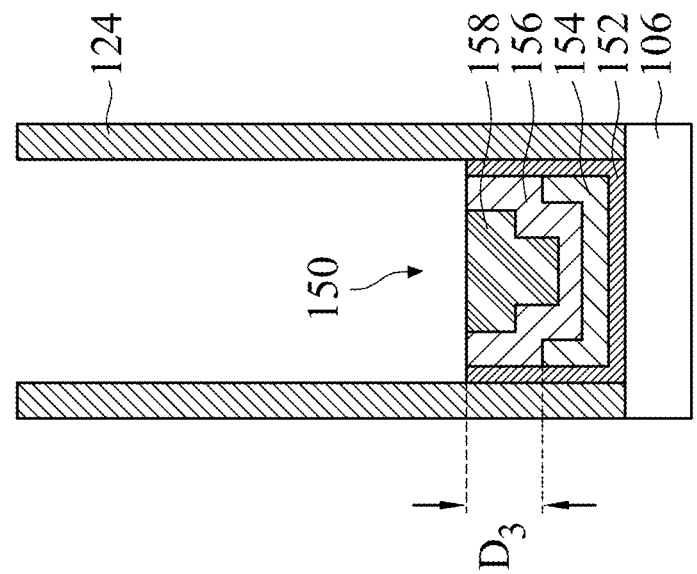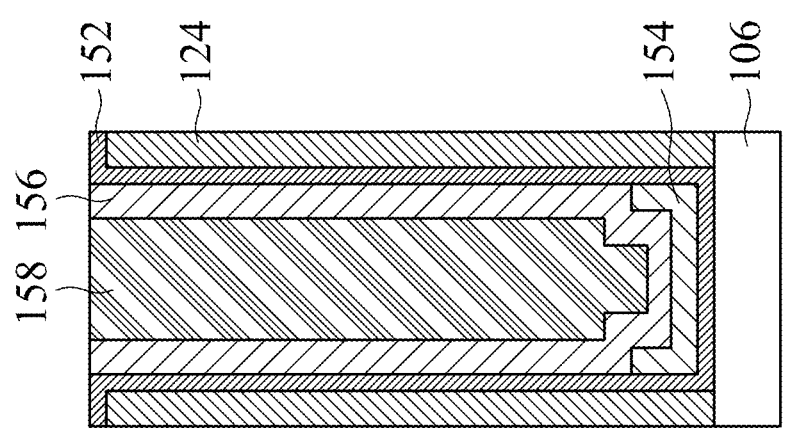

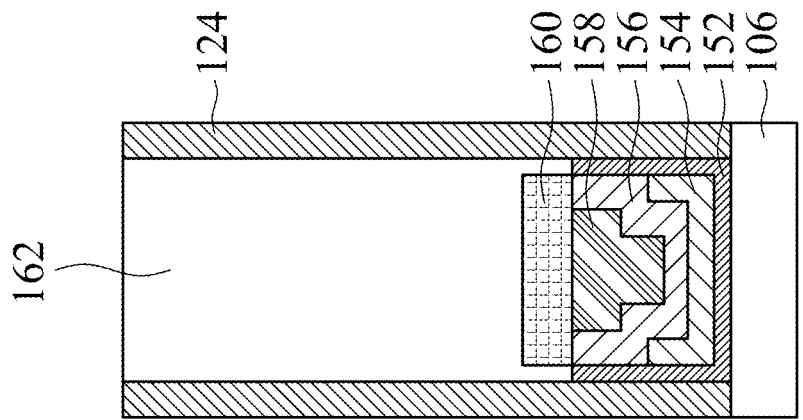
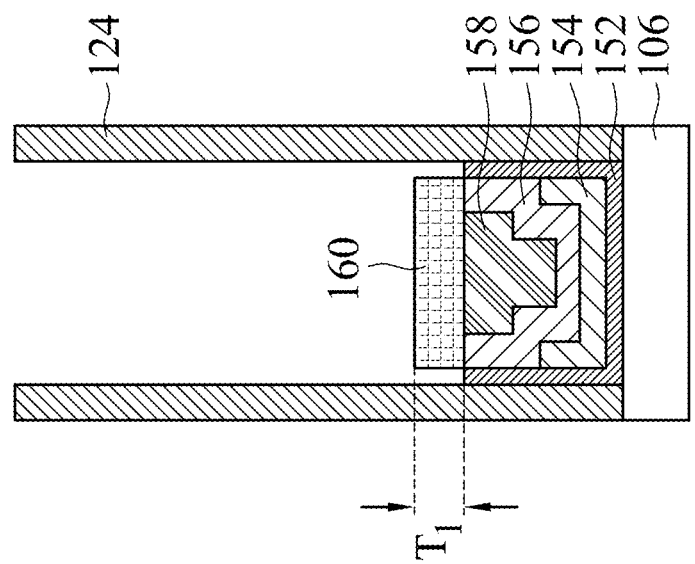
FIG. 5J
FIG. 5I

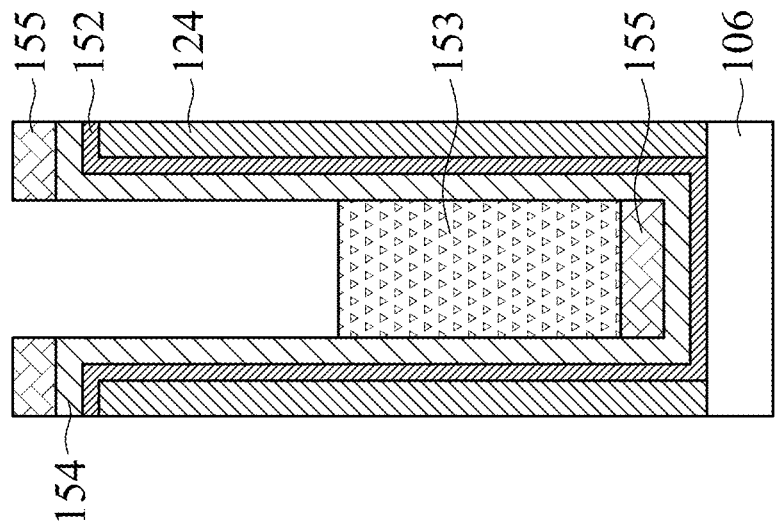
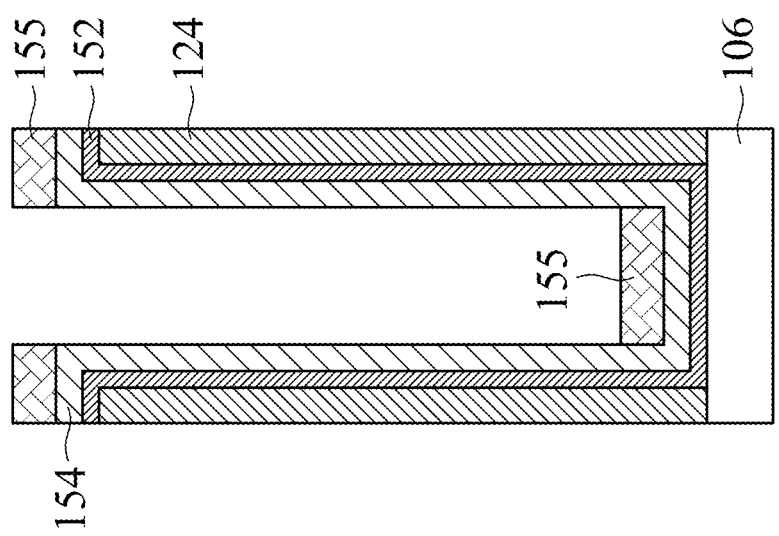
FIG. 7B
FIG. 7A

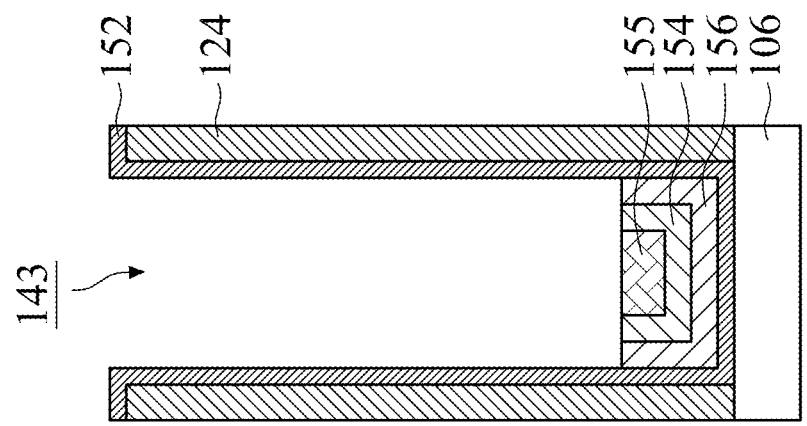
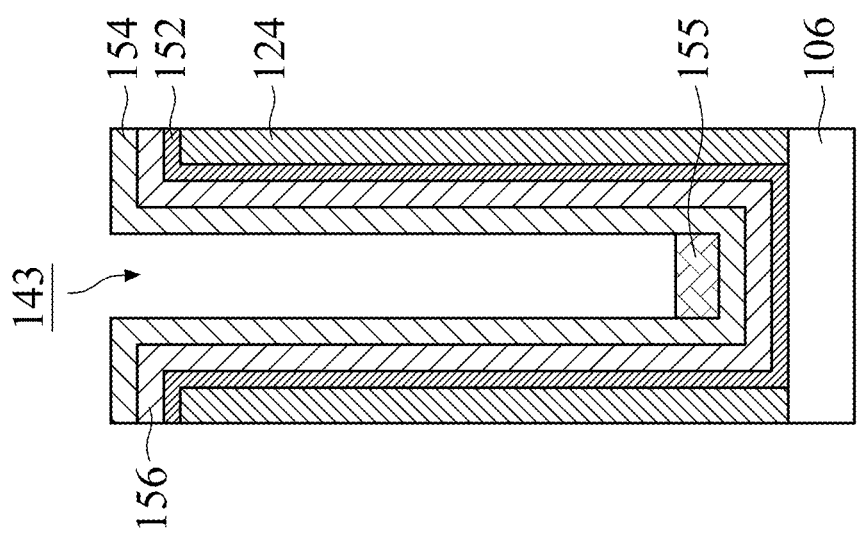

SEMICONDUCTOR TRANSISTOR DEVICE STRUCTURE INCLUDING NANOSTRUCTURE AND GATE STRUCTURE WITH PROTECTION LAYER AND FILL LAYER AND METHOD FOR FORMING THE SAME

CROSS REFERENCE TO RELATED APPLICATIONS

This application is a Continuation application of U.S. patent application Ser. No. 18/068,388, filed on Dec. 19, 2022, which is a Continuation application of U.S. patent application Ser. No. 17/227,057, filed on Apr. 9, 2021, the entirety of which is incorporated by reference herein, which claims the benefit of U.S. Provisional Application No. 63/151,195 filed on Feb. 19, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A shows a cross-sectional representation of the semiconductor device structure along line AA' shown in FIG. 1I, in accordance with some embodiments of the disclosure.

FIG. 2B shows a cross-sectional representation of the semiconductor device structure along line BB' shown in FIG. 1I, in accordance with some embodiments of the disclosure.

FIG. 3A shows a cross-sectional representation of the semiconductor device structure along line AA' shown in FIG. 1J, in accordance with some embodiments of the disclosure.

FIG. 3B shows a cross-sectional representation of the semiconductor device structure along line BB' shown in FIG. 1J, in accordance with some embodiments of the disclosure FIG. 4A shows a cross-sectional representation of the semiconductor device structure along line AA' shown in FIG. 1K, in accordance with some embodiments of the disclosure.

FIG. 4B shows a cross-sectional representation of the semiconductor device structure along line BB' shown in FIG. 1K, in accordance with some embodiments of the disclosure.

FIGS. 5A, 5B, 5C, 5D, 5E, 5F, 5G, 5H, 5I, 5J, and 5K show cross-sectional representations of various stages of forming the semiconductor device structure, in accordance with some embodiments of the disclosure.

FIGS. 7A, 7B, 7C, 7D and 7E show cross-sectional representations of various stages of forming the semiconductor device structure, in accordance with some embodiments of the disclosure.

FIGS. 8A, 8B, 8C, 8D, 8E, 8F, 8G, 8H and 8I show cross-sectional representations of various stages of forming a semiconductor device structure, in accordance with some embodiments of the disclosure.

DETAILED DESCRIPTION

Figure 1A:
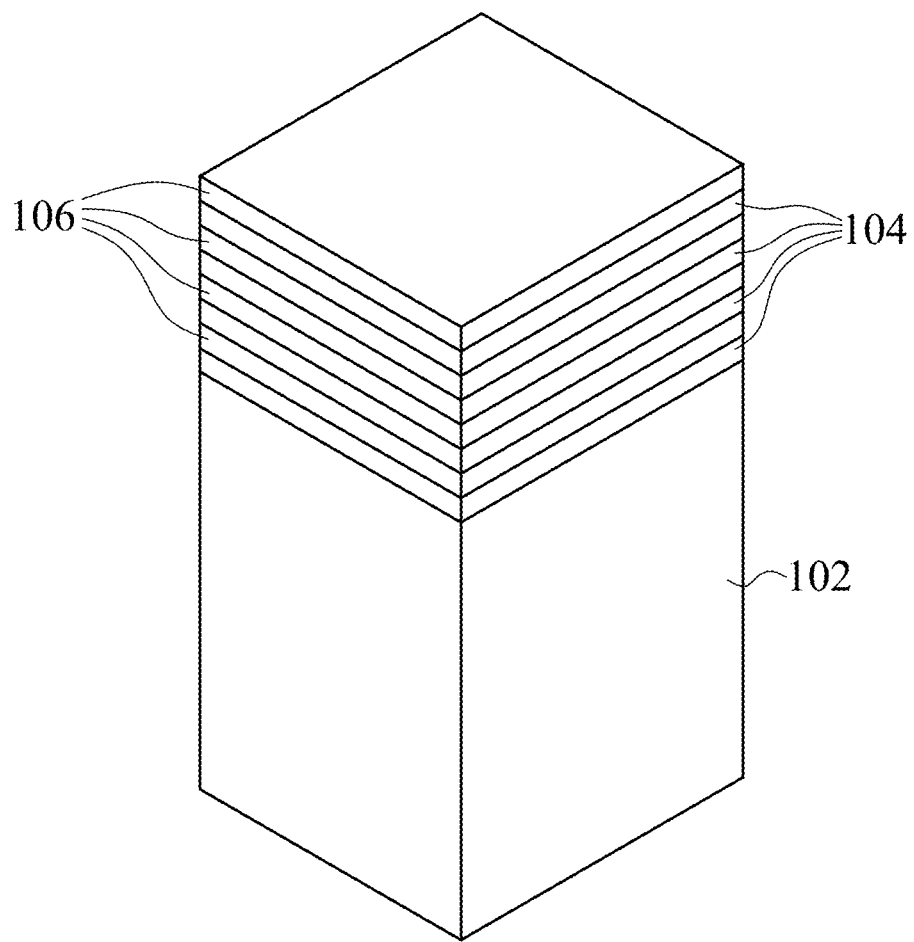
FIGS. 1A, 1B, 1C, 1D, 1E, 1F, 1G, 1H, 1I, 1J and 1K show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. FIGS. 1A-1K show perspective representations of various stages of forming a semiconductor device structure 100a, in accordance with some embodiments of the disclosure. The semiconductor device structure 100a is a gate all around (GAA) transistor structure. In some other embodiments, the semiconductor device structure 100a is a FinFET device structure, a fin structure is formed over a substrate. The gate structure 150 (shown in FIG. 5H) is formed over the fin structure.

As shown in FIG. 1A, a substrate 102 is provided, in accordance with some embodiments. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 104 and a number of second semiconductor layers 106 are sequentially alternately formed over the substrate 102. The semiconductor layers 104 and 106 are vertically stacked to form a stacked nanowire structure (or stacked nanostructures).

In some embodiments, the first semiconductor layers 104 and the second semiconductor layers 106 independently include silicon (Si), germanium (Ge), silicon germanium ($Si_{1-x}Ge_x$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 104 and the second semiconductor layer 106 are made of different materials.

The first semiconductor layers 104 and the second semiconductor layers 106 are made of different materials having different lattice constant. In some embodiments, the first semiconductor layer 104 is made of silicon (Si), and the second semiconductor layer 106 is made of silicon germanium ($Si_{1-x}Ge_x$, 0.1<x<0.7). In some other embodiments, the first semiconductor layer 104 is made of silicon germanium ($Si_{1-x}Ge_x$, 0.1<x<0.7), and the second semiconductor layer 106 is made of silicon (Si).

In some embodiments, the first semiconductor layers 104 and the second semiconductor layers 106 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 104 and the second semiconductor layers 106 are formed in-situ in the same chamber.

In some embodiments, the thickness of each of the first semiconductor layers 104 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 104 are substantially uniform in thickness. In some embodiments, the thickness of each of the second semiconductor layers 106 is in a range from about 1.5 nm to about 20 nm. In some embodiments, the second semiconductor layers 106 are substantially uniform in thickness.

Figure 1B:
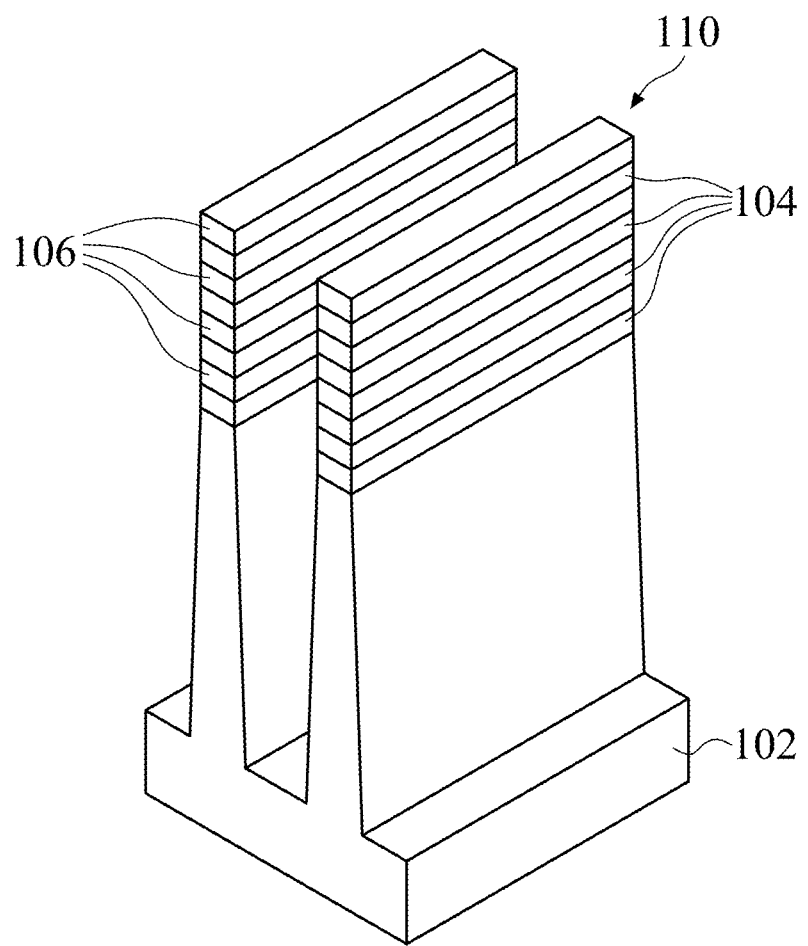

Next, as shown in FIG. 1B, the first semiconductor layers 104 and the second semiconductor layers 106 are patterned to form a fin structure 110, in accordance with some embodiments.

Figure 1C:
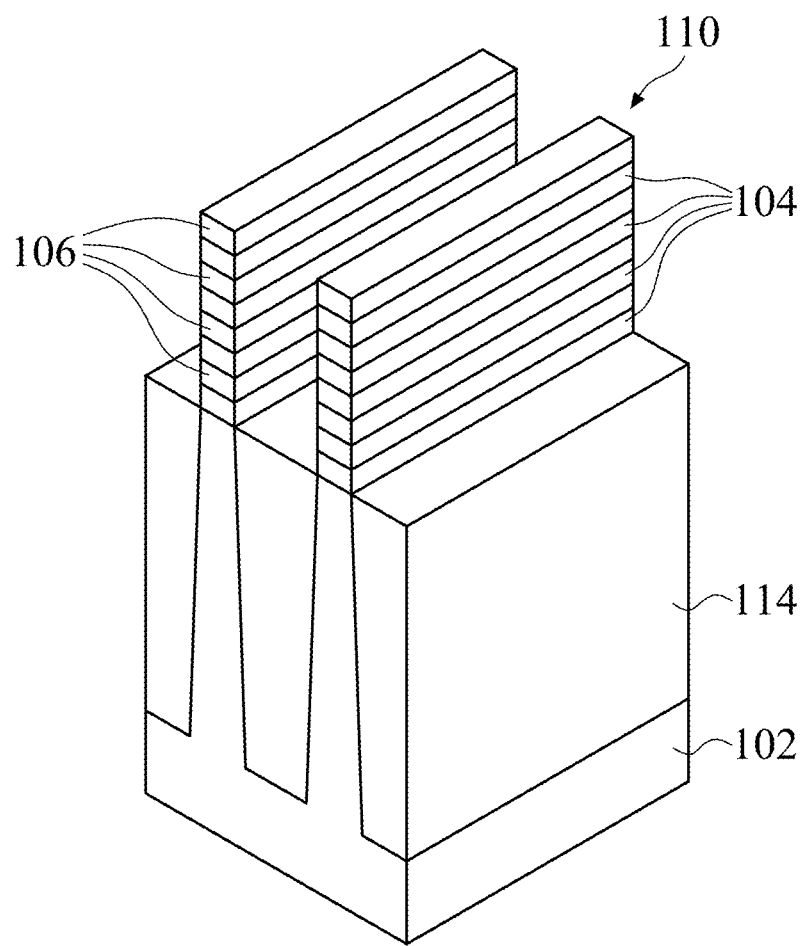

Afterwards, as shown in FIG. 1C, an isolation structure 114 is formed over the substrate 102, in accordance with some embodiments. The isolation structure 114 may be a shallow trench isolation (STI) structure surrounding the fin structure 110. The top portion of the fin structure 110 is above the isolation structure 114. A lower portion of the fin structure 110 is surrounded by the isolation structure 114, and an upper portion of the fin structure 110 protrudes from the isolation structure 114.

Figure 1D:
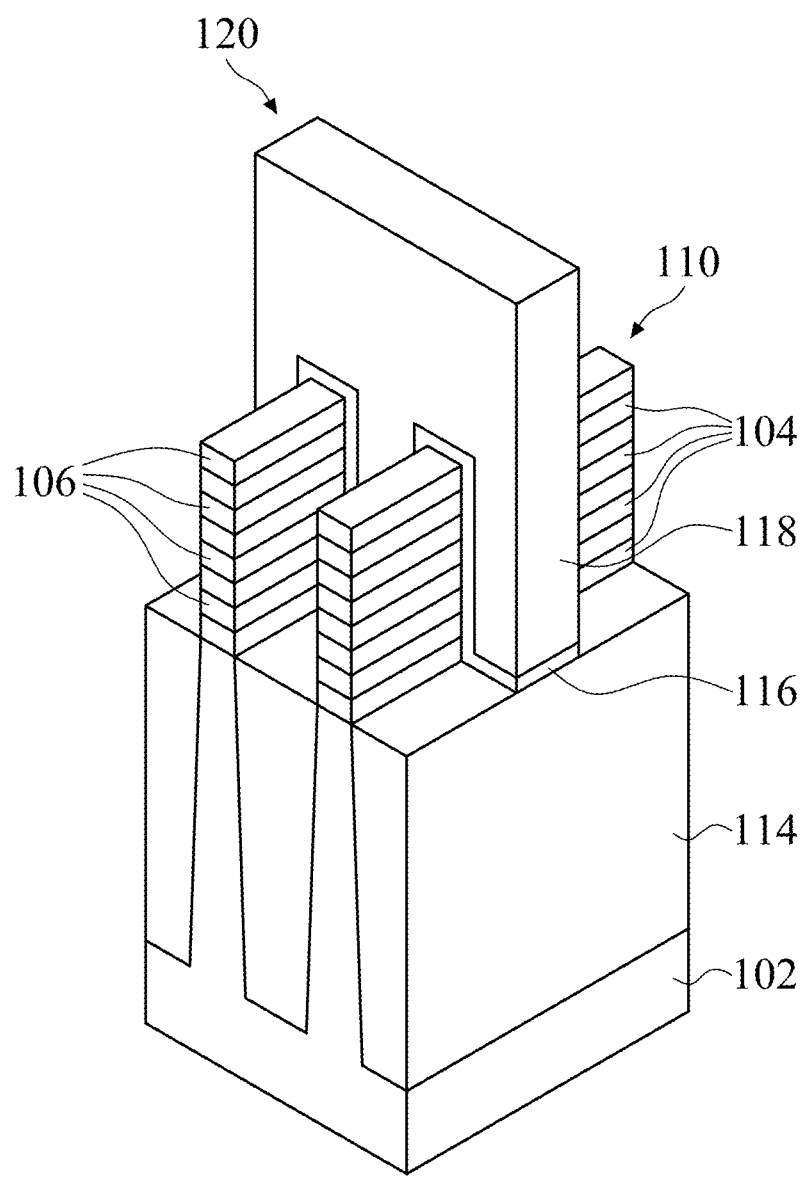

Next, as shown in FIG. 1D, a dummy gate dielectric layer 116 is formed over the fin structure 110, and then a dummy gate electrode layer 118 is formed on the dummy gate dielectric layer 116, in accordance with some embodiments. Afterwards, the dummy gate dielectric layer 116 and the dummy gate electrode layer 118 are patterned by a patterning process. The dummy gate structure 120 is constructed by the dummy gate dielectric layer 116 and the dummy gate electrode layer 118.

The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The dummy gate electrode layer 118 is formed to partially cover and to extend across the fin structure 110. In some embodiments, the dummy gate electrode layer 118 wraps around the fin structure 110. The dummy gate dielectric layer 116 may be made of or include silicon oxide. In some embodiments, the dummy gate dielectric layers 116 is formed by a deposition process, such as chemical vapor deposition (CVD) process, physical vapor deposition (PVD) process, atomic layer deposition (ALD) process, another applicable process, or a combination thereof.

In some embodiments, the dummy gate electrode layer 118 is made of polycrystalline-silicon (poly-Si) or polycrystalline silicon-germanium (poly-SiGe). In some embodiments, the dummy gate electrode layer 118 is formed by a deposition process, such as chemical vapor deposition (CVD) process, physical vapor deposition (PVD) process, atomic layer deposition (ALD) process, another applicable process, or a combination thereof.

Figure 1E:
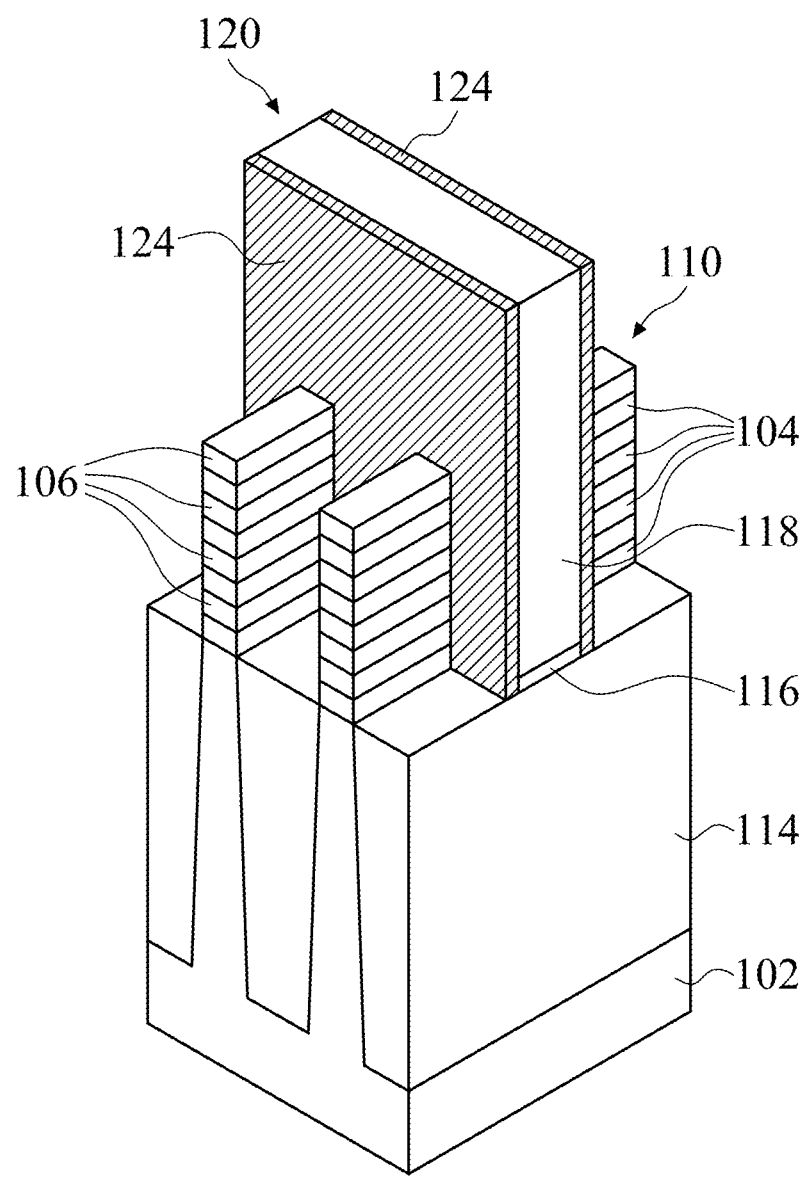

Afterwards, as shown in FIG. 1E, a gate spacer layer 124 is formed on opposite sidewall surfaces of the dummy gate electrode layer 118 and over the dummy gate dielectric layer 116, in accordance with some embodiments. The gate spacer layer 124 can provide more protection to the dummy gate structure 120 during subsequent processes.

In some embodiments, the gate spacer layer 124 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 124 is formed by a deposition process, such as chemical vapor deposition (CVD) process, physical vapor deposition (PVD) process, atomic layer deposition (ALD) process, another applicable process, or a combination thereof.

Figure 1F:
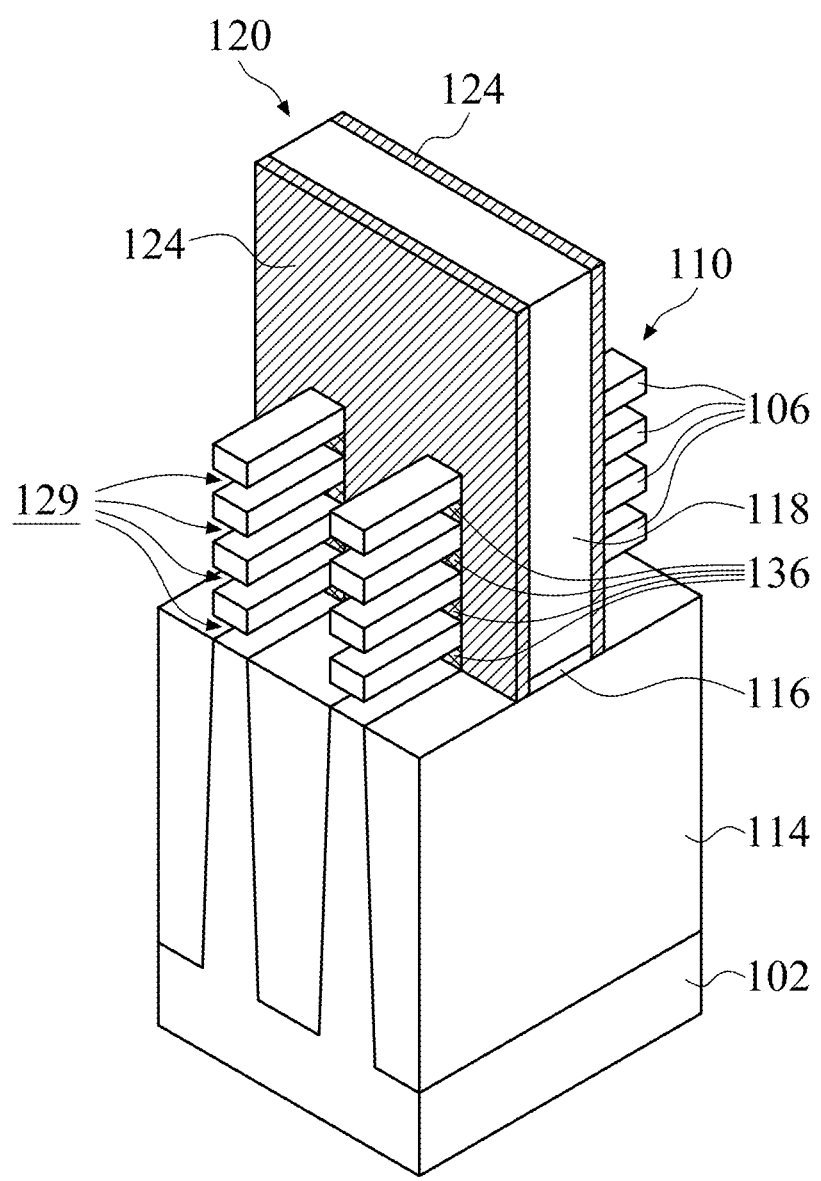
Figure 1G:
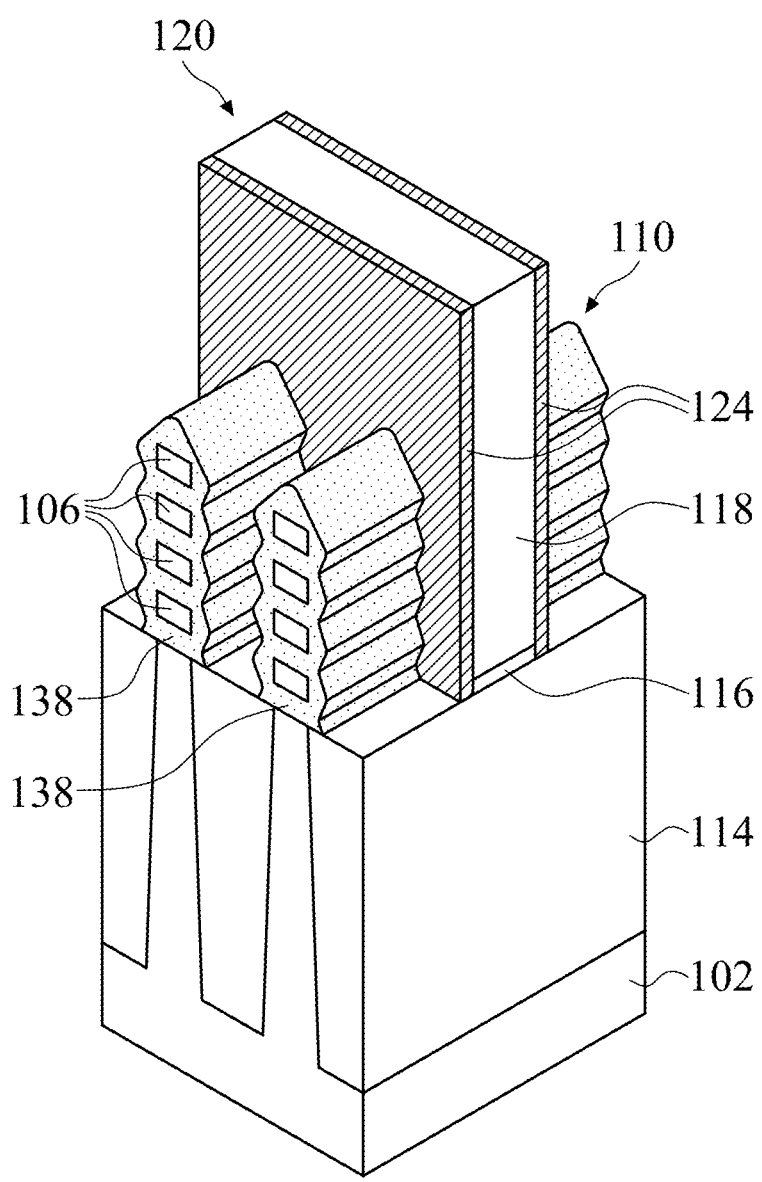

Next, as shown in FIG. 1F, a portion of the first semiconductor layers 104 is removed to form an S/D trench 129, in accordance with some embodiments. The S/D trench 129 is between two adjacent second semiconductor layers 106.

Next, another portion of the first semiconductor layers 104 directly below the gate spacer layer 124 is removed to form a cavity (not shown), and the cavity is exposed by the S/D trench 129. Afterwards, an inner spacer layer 136 is formed in the cavity. The inner spacer layer 136 is directly below the gate spacer layer 124. The inner spacer layer 136 is used to be as a barrier between an S/D structure 138 (formed later, FIG. 1G) and a gate structure 150 (formed later, as shown in FIG. 1K). The inner spacer layer 136 can reduce the parasitic capacitance between the S/D structure 138 (formed later, FIG. 1G) and the gate structure 150 (formed later, as shown in FIG. 1K).

Afterwards, as shown in FIG. 1F, a S/D structure 138 is formed in the S/D trench 129, in accordance with some embodiments. The S/D structure 138 is in direct contact with the inner spacer layer 136.

The S/D structure 138 may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The S/D structure 138 may doped with one or more dopants. In some embodiments, the S/D structure 138 is silicon (Si) doped with phosphorus (P), arsenic (As), antimony (Sb), or another applicable dopant. Alternatively, the S/D structure 138 is silicon germanium (SiGe) doped with boron (B) or another applicable dopant.

In some embodiments, the S/D structure 138 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 1H:
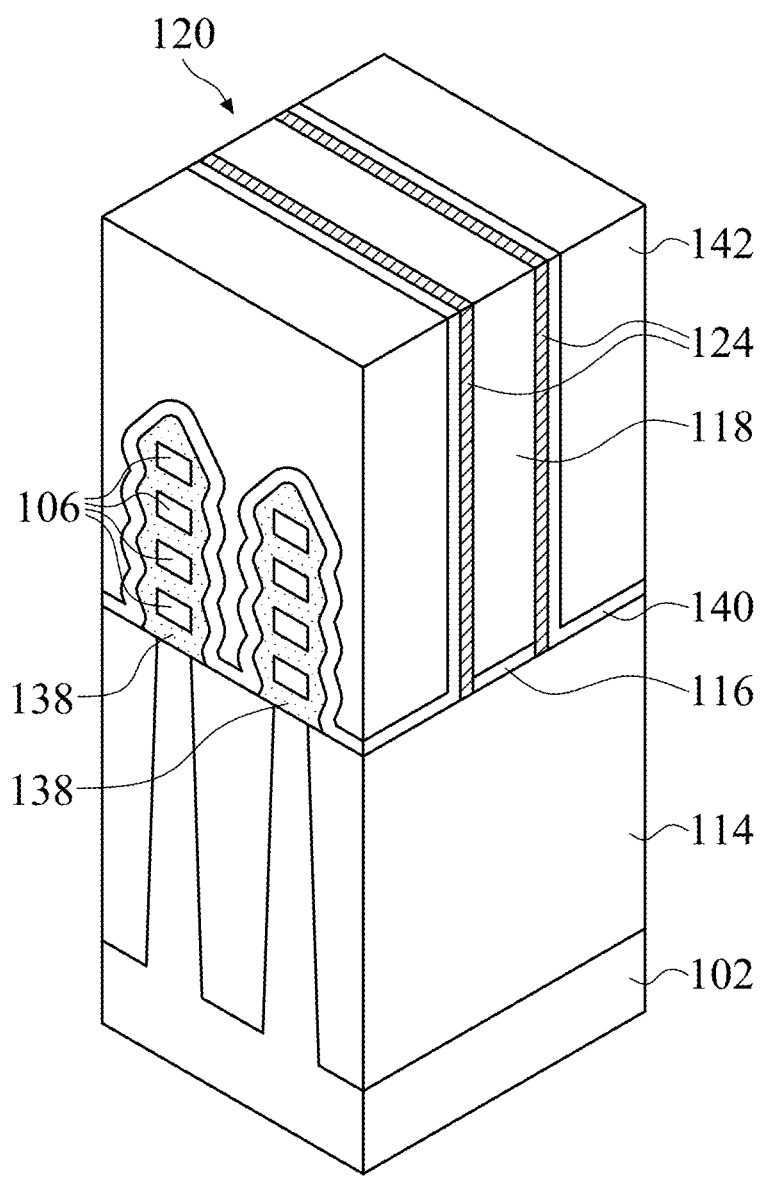

Next, as shown in FIG. 1H, a contact etch stop layer (CESL) 140 is formed over the S/D structures 138, and an inter-layer dielectric (ILD) layer 142 is formed over the CESL 140, in accordance with some embodiments. Next, a portion of the ILD layer 142 is removed to expose the top surface of the dummy gate electrode layer 118. In some embodiments, the portion of the ILD layer 142 is removed by a planarizing process, a chemical mechanical polishing (CMP) process.

In some embodiments, the CESL 140 is made of silicon nitride, silicon oxynitride, and/or other applicable materials. The CESL 140 may be formed by a plasma enhanced chemical vapor deposition (CVD) process, low pressure CVD process, atomic layer deposition (ALD) process, or another applicable processes.

The ILD layer 142 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 142 may be formed by a chemical vapor deposition (CVD) process, physical vapor deposition (PVD) process, atomic layer deposition (ALD) process, spin-on coating process, or other applicable processes.

Figure 1I:
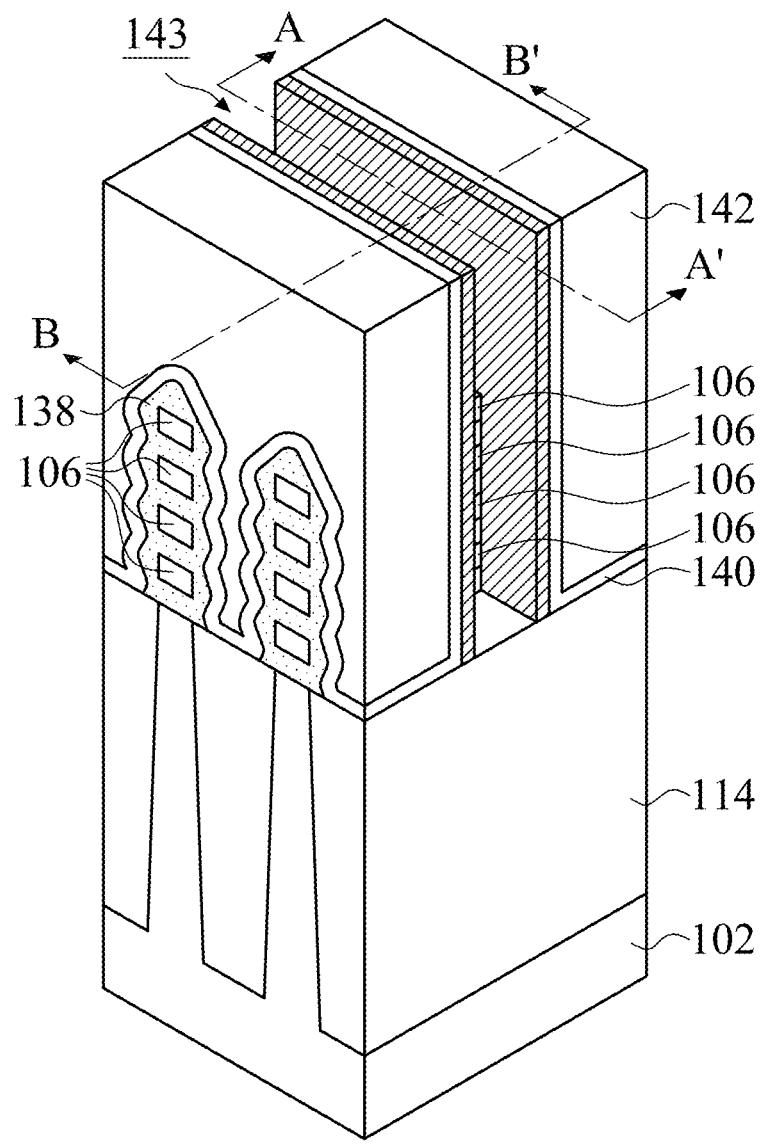

Afterwards, as shown in FIG. 1I, the dummy gate structure 120 is removed to form a trench 143 in the ILD layer 142, in accordance with some embodiments. The dummy gate dielectric layer 116 and the dummy gate electrode layer 118 are removed by an etching process, such as a dry etching process or a wet etching process.

FIG. 2A shows a cross-sectional representation of the semiconductor device structure along line AA' shown in FIG. 1I, in accordance with some embodiments of the disclosure. FIG. 2B shows a cross-sectional representation of the semiconductor device structure along line BB' shown in FIG. 1I, in accordance with some embodiments of the disclosure.

As shown in FIGS. 2A and 2B, the first semiconductor layers 104 and the second semiconductor layers 106 are exposed by the trench 143.

Figure 1J:
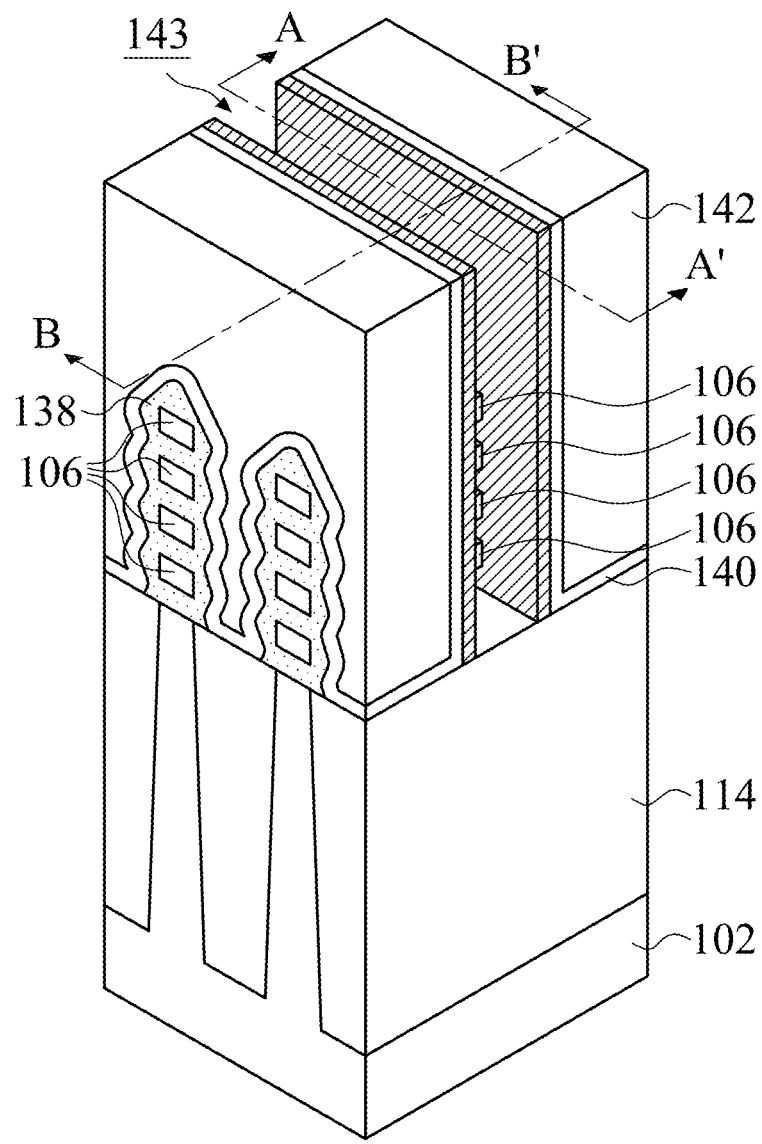
Figure 1K:
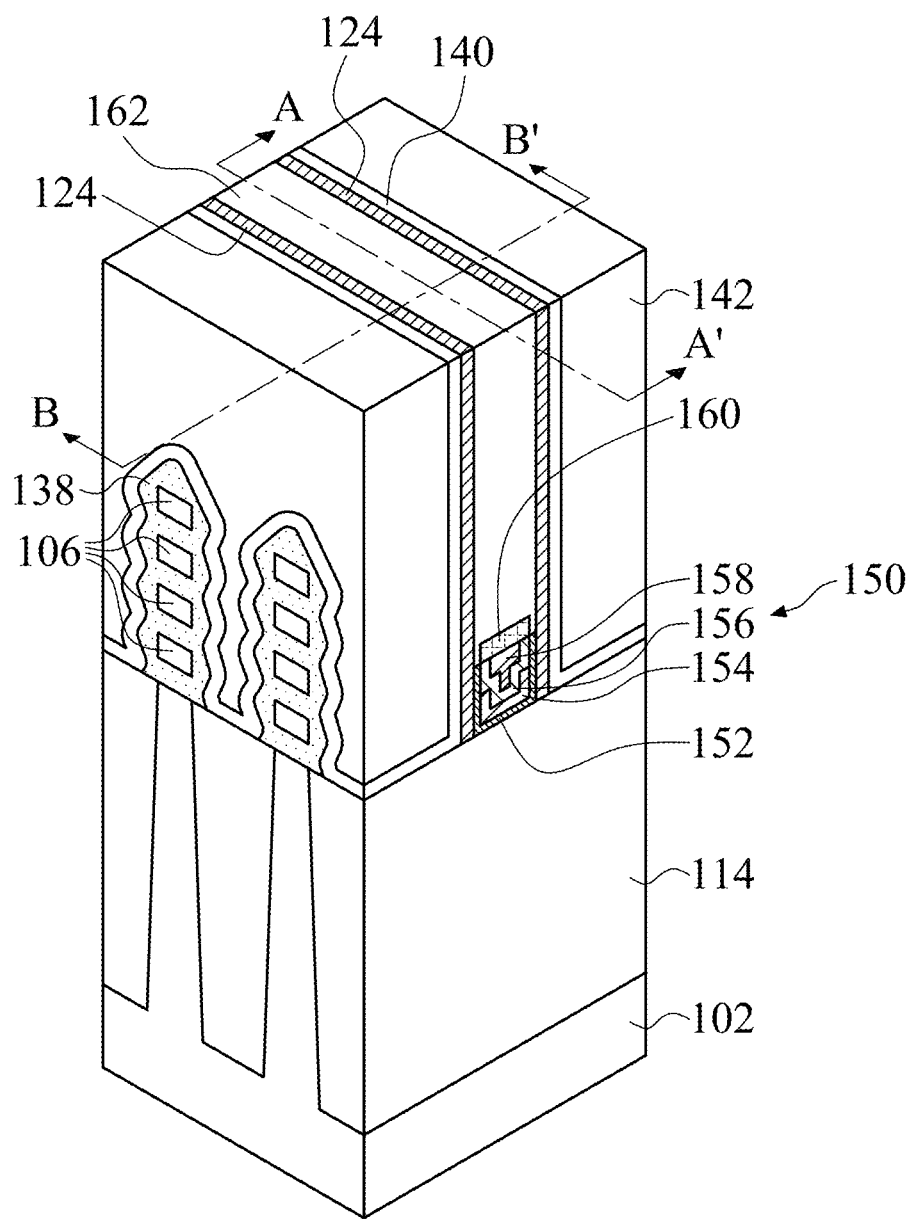

Afterwards, as shown in FIG. 1J, the first semiconductor layers 104 are removed to form a number of gaps 145, in accordance with some embodiments of the disclosure. Each of the gaps 145 is formed between two adjacent second semiconductor layers 106. Since the first semiconductor layers 104 and the second semiconductor layers 106 are made of different materials, they have different etching selectivity. Therefore, the first semiconductor layers 104 are removed, but the second semiconductor layers 106 are left.

The remaining second semiconductor layers 106 are used to as channel region of the semiconductor device structure 100a. In some embodiments, the second semiconductor layers 106 may be referred to as "nanostructures", "nanowires", or "nanosheets". Therefore, the first fin structure 110 includes a number of nanostructures stacked in a vertical direction.

FIG. 3A shows a cross-sectional representation of the semiconductor device structure along line AA' shown in FIG. 1J, in accordance with some embodiments of the disclosure. FIG. 3B shows a cross-sectional representation of the semiconductor device structure along line BB' shown in FIG. 1J, in accordance with some embodiments of the disclosure.

As shown in FIGS. 3A and 3B, the gaps 145 are between two adjacent second semiconductor layers 106, and the gaps 145 are exposed by the trench 143.

Next, as shown in FIG. 1K, a gate dielectric layer 152, a first layer 154, a second layer 156 and a fill layer 158 are formed in the trench 143 and gaps 145, in accordance with some embodiments of the disclosure. A gate structure 150 is constructed by the gate dielectric layer 152, the first layer 154 and the second layer 156 and the fill layer 158. Next, a protection layer 160 is formed on the fill layer 158, and an insulating layer 162 is formed over the protection layer 160. The first layer 154 and the second layer 156 are made of different materials. The first layer 154, the second layer 156 and the fill layer 158 are made of different materials. The insulating layer 162 includes a protruding portion in direct contact with the gate dielectric layer 152.

FIG. 4A shows a cross-sectional representation of the semiconductor device structure along line AA' shown in FIG. 1K, in accordance with some embodiments of the disclosure. FIG. 4B shows a cross-sectional representation of the semiconductor device structure along line BB' shown in FIG. 1K, in accordance with some embodiments of the disclosure.

As shown in FIGS. 4A and 4B, the first layer 154 has a U-shaped structure, and the second layer 156 is formed over the first layer 154. The fill layer 158 is separated from the first layer 152 by the second layer 154, and the protection layer 160 is separated from the first layer 152 by the second layer 154 and the fill layer 158. The protection layer 160 is selectively formed on the fill layer 158 and the second layer 154, but not on the gate dielectric layer 152.

Figure 5B:
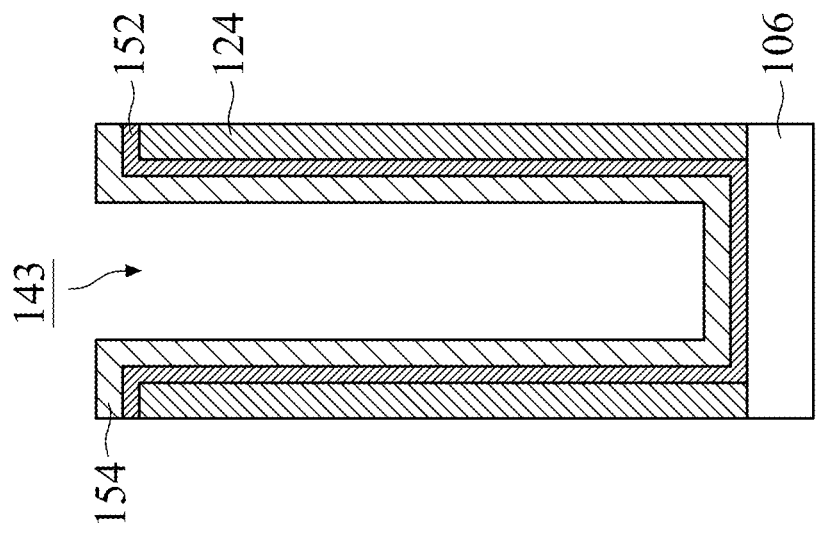
Figure 5A:
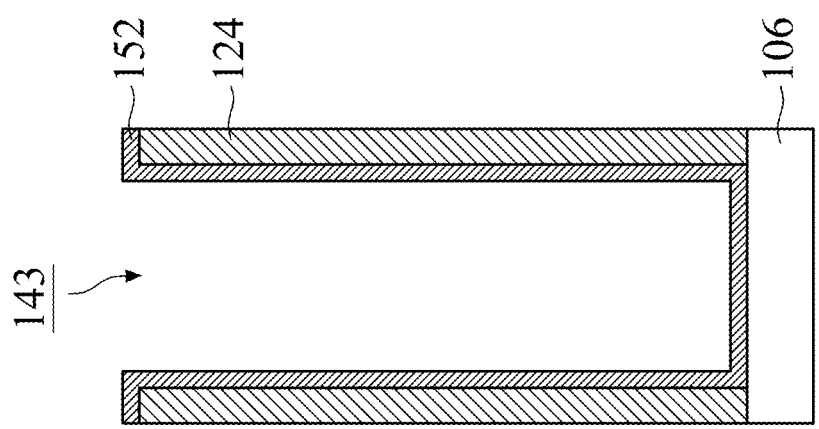

FIGS. 5A-5K show cross-sectional representations of various stages of forming the semiconductor device structure 100a, in accordance with some embodiments of the disclosure. FIG. 5A shows an enlarged region A of FIG. 3B, in accordance with some embodiments of the disclosure. FIGS. 5A-5K show the detail processes for forming the gate structure 150 in the trench 143 and gaps 145.

As shown in FIG. 5A, the gate dielectric layer 152 is formed in the trench 143 and on the gate spacer layer 124. The trench 143 is not completely filled with the gate dielectric layer 152.

In some embodiments, the gate dielectric layer 152 is a high-k dielectric layer. In some embodiments, the high-k gate dielectric layer is made of one or more layers of a dielectric material, such as $HfO_2$, HfSiO, HfSiON, HfTaO, HfTIO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layer 152 is formed by using a chemical vapor deposition (CVD) process, physical vapor deposition (PVD) process, atomic layer deposition (ALD) process, another applicable process, or a combination thereof.

Next, as shown in FIG. 5B, the first layer 154 is formed over the gate dielectric layer 152, in accordance with some embodiments of the disclosure. The first layer 154 is conformally formed in the trench 143.

The first layer 154 is a conductive layer. The first layer 154 may be a single layer or a multiple layer. In some embodiments, the first layer 154 comprises a n-work function material. In some embodiments, the first layer 154 comprises a Si-containing material, a Al-containing material, or a combination thereof. In some embodiments, the Si-containing material is made of TiSiN, TiSiC, TiSiAlC or a combination thereof. In some embodiments, the Al-containing material is made of TiAlC, TaAlC, TiSiAlC, TiAlN, AlN or a combination thereof. In some embodiments, the first layer 154 is formed by using chemical vapor deposition (CVD) process, physical vapor deposition (PVD) process, atomic layer deposition (ALD) process, another applicable method, or a combination thereof.

Figure 5D:
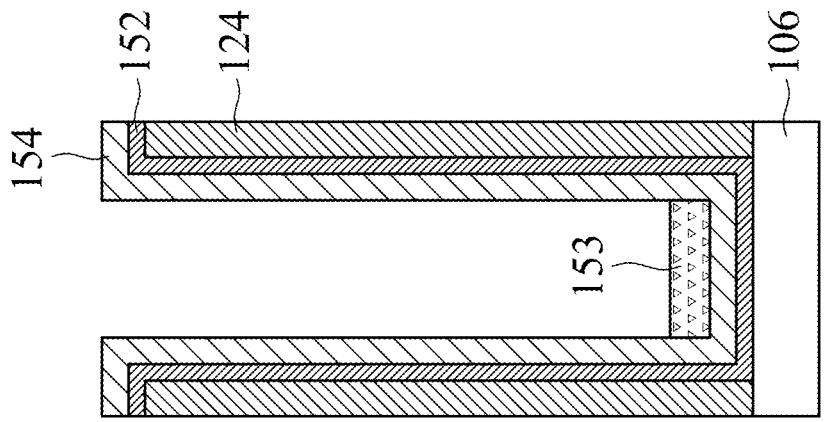
Figure 5C:
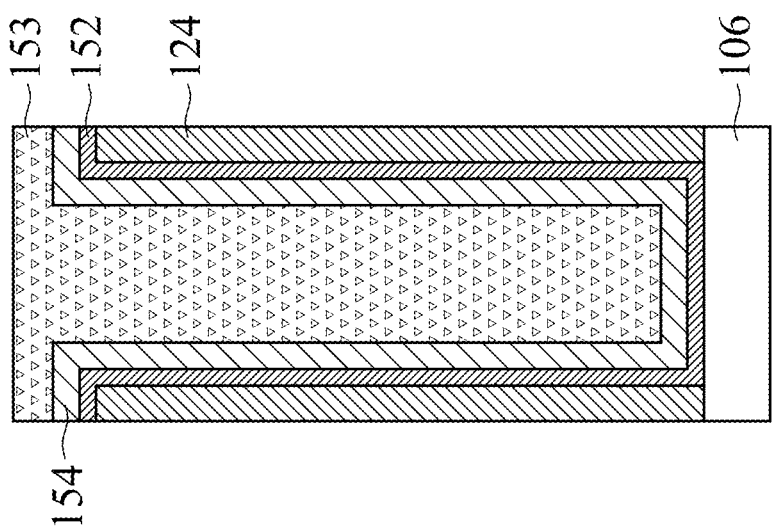

Afterwards, as shown in FIG. 5C, a dummy layer 153 is formed over the first layer 154 and in the trench 143, in accordance with some embodiments of the disclosure. The trench 143 is completely filled with the gate dielectric layer 152, the first layer 154 and the dummy layer 153.

The dummy layer 153 is used to protect the underlying layers. In some embodiments, the dummy layer 153 is made of Spin-on-Glass (SOG), Spin-on-Carbon (SOC), anti-reflective coating (ARC), another applicable material, or a combination thereof. In some embodiments, the dummy layer 153 is formed by using a chemical vapor deposition (CVD) process, physical vapor deposition (PVD) process, atomic layer deposition (ALD), another applicable process, or a combination thereof.

Afterwards, as shown in FIG. 5D, a portion of the dummy layer 153 is removed, in accordance with some embodiments of the disclosure. As a result, a portion of the first layer 154 is exposed. In some embodiments, the portion of the dummy layer 153 is removed by an etching process, such as a wet etching process or a dry etching process.

Figure 5F:
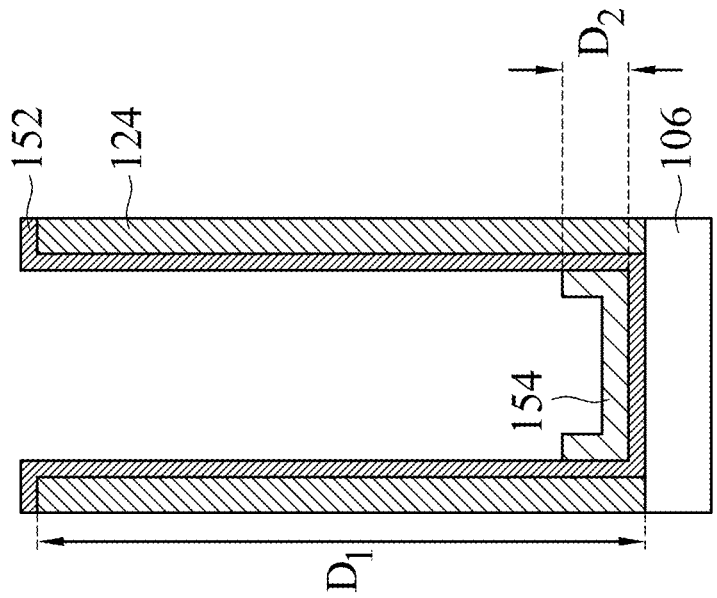
Figure 5E:
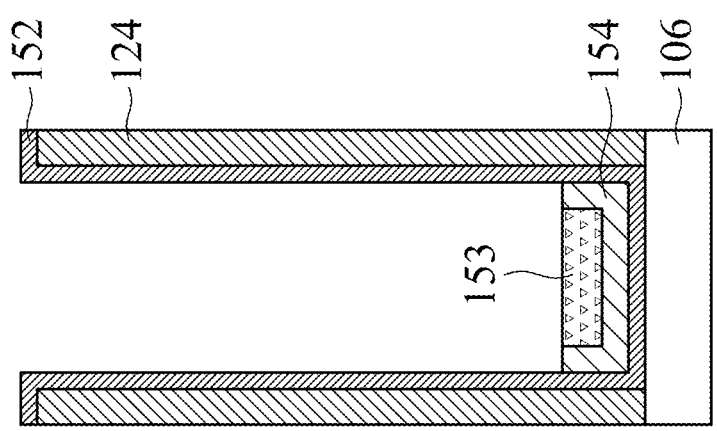

Afterwards, as shown in FIG. 5E, a portion of the first layer 154 is removed to expose a portion of the gate dielectric layer 152 by using the remaining dummy layer 153 as a mask, in accordance with some embodiments of the disclosure. The remaining first layer 154, which is covered by the dummy layer 153, is not removed. The top surface of the first layer 154 is lower than the top surface of the gate spacer layer 124.

Next, as shown in FIG. 5F, the dummy layer 153 is removed, in accordance with some embodiments of the disclosure. In some embodiments, the dummy layer 153 is removed by an etching process, such as a wet etching process or a dry etching process. As a result, the first layer 154 has a U-shaped structure.

The trench 153 has a first depth $D_1$. In some embodiments, the first depth $D_1$ is in a range from about 30 nm to about 200 nm. The remaining first layer 154 has a second depth $D_2$. In some embodiments, the second depth $D_2$ is in a range from about 1 nm to about 10 nm.

Next, as shown in FIG. 5G, the second layer 156 is formed over the first layer 154 and in the trench 143, and the fill layer 158 is formed over the second layer 156 and the gate spacer layer 124, in accordance with some embodiments of the disclosure. Next, a portion of the second layer 156 and a portion of the fill layer 158 outside of the trench 143 are removed by a planarizing process, a chemical mechanical polishing (CMP) process.

The second layer 156 is a conductive layer. The second layer 156 may be a single layer or a multiple layer. In some embodiments, the second layer 156 comprises a p-work function material. In some embodiments, the second layer 156 is made of TiN, TaN, WCN, WSi, Ti, Ni, Co or a combination thereof. In some embodiments, the second layer 156 is formed by using a chemical vapor deposition (CVD) process, physical vapor deposition (PVD) process, atomic layer deposition (ALD) process, another applicable process, or a combination thereof.

The fill layer 158 is also a conductive layer. The fill layer 158 may be a single layer or a multiple layer. In some embodiments, the fill layer 158 is made of aluminum, copper, titanium, tantalum, tungsten, cobalt, molybdenum, tantalum nitride, nickel silicide, cobalt silicide, TIN, WN, TiAl, TiAlN, TaCN, TaC, TaSiN, metal alloys, another suitable material, or a combination thereof. In some embodiments, the filling layer 158 is formed by using chemical vapor deposition (CVD) process, physical vapor deposition (PVD) process, atomic vapor deposition (ALD) process, electroplating, another applicable method, or a combination thereof.

Next, as shown in FIG. 5H, a portion of the gat dielectric layer 152, a portion of the second layer 156 and a portion of the fill layer 158 are removed, in accordance with some embodiments of the disclosure. As a result, the top surface of the fill layer 158 is lower than the top surface of the gate spacer layer 124. In some embodiments, the top surface of the fill layer 158 is substantially level with the top surface of the second layer 156 and the top surface of the gate dielectric layer 152. The fill layer 158 has a T-shaped structure.

The portion of the gat dielectric layer 152, the portion of the second layer 156 and the portion of the fill layer 158 are removed by an etching process, such as a wet etching process or a dry etching process.

There is a third depth $D_3$ which is measured from the top surface of the second layer 156 to the top surface of the first layer 154. In some embodiments, the third depth $D_3$ is in a range from about 1 nm to about 20 nm.

Next, as shown in FIG. 5I, the protection layer 160 is formed on the fill layer 158 and on the second layer 156, in accordance with some embodiments of the disclosure. The protection layer 160 is formed on the exposed top surface of the fill layer 158 and the exposed top surface of the second layer 156. The top surface of the second layer 156 is in direct contact with the bottom surface of the protection layer 160. The top surface of the fill layer 158 is in direct contact with the bottom surface of the protection layer 160. The fill layer 158 is surrounded by the second layer 156 and the protection layer 160.

The surface treatment process is used to activate the top surface of the fill layer 158 and the second layer 156. In some embodiments, the surface treatment process includes using hydrogen ($H_2$) gas. When hydrogen ($H_2$) gas is used, the native metal oxide on top surface of the layer 158 and top surface of the second layer 156 are removed and then formed hydrogen radicals on the top surface. Meanwhile, the dielectric gate spacer layer 124 is not reacted with hydrogen. Hence, the hydrogen radicals are selectively formed on the top surface of the fill layer 158 and the second layer 156 to facilitate the formation of the protection layer 160.

Next, the protection layer 160 is formed by a deposition process. The deposition process includes supplying a precursor only on the top surface of the fill layer 158 and on the top surface of the second layer 156, but not on dielectric gate spacer layer 124. In some embodiments, the precursor includes tungsten (W)-containing material, such as tungsten hexafluoride ($WF_6$) or tungsten hexachloride ($WCl_6$). The precursor reacts with the hydrogen radicals to form the protection layer 160.

The protection layer 160 is used as an etching stop layer to protect the underlying layers. In addition, the protection layer 160 has a low gate resistance (Rg). If the protection layer 160 is too thin or is not well formed, the protection effect is not good enough.

It should be noted that the protection layer 160 is selectively formed on conductive material (such as the fill layer 158 and the second layer 156), but not formed on the insulating material (e.g. the gate dielectric layer 152). In some embodiments, the first layer 154 includes a Si-containing material, a Al-containing material, or a combination thereof. In some embodiments, the protection layer 160 is not formed on the first layer 154 since the material of the first layer 154 is easily to oxidize to become insulating (e.g. metal oxide layer).

Since the protection layer 160 is not formed on the first layer 154, if the first layer 154 is exposed after the process of FIG. 5H, and the exposed first layer will be etched or damaged by the subsequent etching processes (for forming an opening to form an contact structure). The first layer 154 is not exposed and is covered by the second layer 156 and the fill layer 158. The formation quality of the protection layer 160 is improved by using the fill layer 158 between the first layer 154 and the protection layer 160.

In addition, the protection layer 160 is separated from the first layer 154 by the second layer 156 and the fill layer 158. The fill layer 158 is separated from the first layer 154 by the second layer 156.

The protection layer 160 has a first thickness $T_1$. In some embodiments, the first thickness $T_1$ is in a range from about 1 nm to about 20 nm. If the thickness is too small, the protection effect is not good enough. If the thickness is too large, the final gate height is too tall, which leaded to large gate-to-source capacitance resulted in device alternating current (AC) performance degradation.

Next, as shown in FIG. 5J, the insulating layer 162 is formed in the trench 143 and on the protection layer 160 and on the gate dielectric layer 152, in accordance with some embodiments of the disclosure. The insulating layer 162 includes a protruding portion in direct contact with the gate dielectric layer 152.

In some embodiments, the insulating layer 162 is made of $SiO_2$, $Si_3N_4$, SiON, SiOCN, SiOCH or another applicable material. In some embodiments, the insulating layer 162 is formed by a chemical vapor deposition (CVD) process, physical vapor deposition (PVD) process, atomic layer deposition (ALD) process, spin-on coating process, or another applicable processes.

Figure 5K:
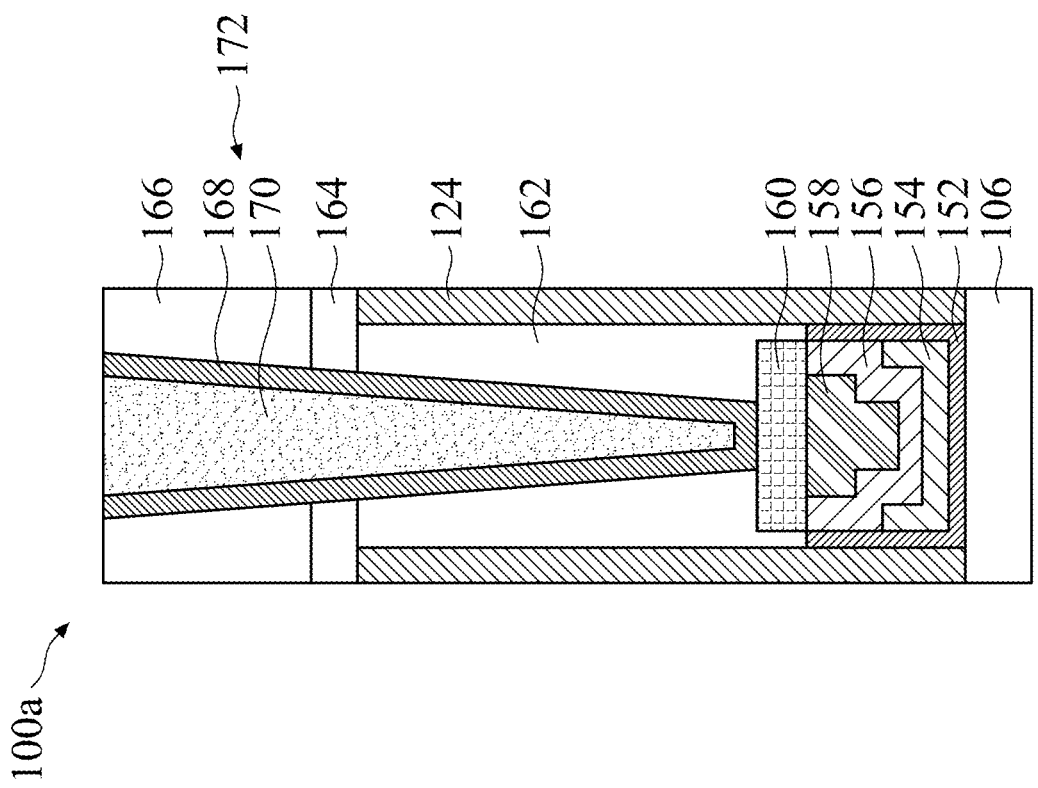

Next, as shown in FIG. 5K, an etching stop layer 164 and a second dielectric layer 166 are formed on the gate spacer layer 124 and the insulating layer 162, in accordance with some embodiments of the disclosure. An opening (not shown) is formed through the second dielectric layer 166 and the etching stop layer 164 and the insulating layer 162, and then a barrier layer 168 and a conductive layer 170 is formed in the opening. A gate contact structure 172 includes a U-shaped barrier layer 168 and the conductive layer 170, and the U-shaped barrier layer 168 is in direct contact with the protection layer 160. The gate contact structure 172 is through the insulating layer 162, the etching stop layer 164 and the second dielectric layer 166. The gate contact structure 172 is electrically connected to the gate structure 150 by the protection layer 160.

In some embodiments, the barrier layer 168 is made of tantalum (Ta), tantalum nitride (TaN), titanium (Ti), titanium nitride (TiN), cobalt tungsten (CoW) or another applicable material. In some embodiments, the barrier layer 168 is made of Ti/TiN/W, and tungsten (W) in the barrier layer 168 has a smaller grain size than the grain size of the conductive layer 170 when the conductive layer 168 is made of tungsten (W).

In some embodiments, the barrier layer 168 is formed by a deposition process, such as a chemical vapor deposition (CVD) process, physical vapor deposition (PVD) process, atomic layer deposition (ALD) process, plating process or another application process.

In some embodiments, the conductive layer 170 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive layer 170 is formed by a deposition process, such as a chemical vapor deposition (CVD) process, physical vapor deposition (PVD) process, atomic layer deposition (ALD) process, plating process or another application process.

If no protection layer over the gate structure 150, when the opening is formed through the insulating layer 162, the gate structure 150 may be damaged. The protection layer provides an etching stop function to protect the underlying gate structure 150 from being damaged. Since the protection layer 160 may not tend to form on the first layer 154, the first layer 154 is separated from the protection layer 160 by the second layer 156 and the fill layer 158. The protection 160 is not in direct contact with the first layer 154 to make sure the formation quality of the protection layer 160.

It should be noted that the protection layer 160 is formed on the second layer 156 and the fill layer 158 to provide sufficient protection to prevent the underlying gate structure 150 form being damaged by any etching process. In some embodiments, a first width of the bottom surface of the protection layer 160 is greater than a second width of the top surface of the fill layer 158. The protection layer 160 is not only have protection but also provide low gate resistance (Rg). Therefore, the performance of the semiconductor device structure 100a is improved.

Figure 6B:
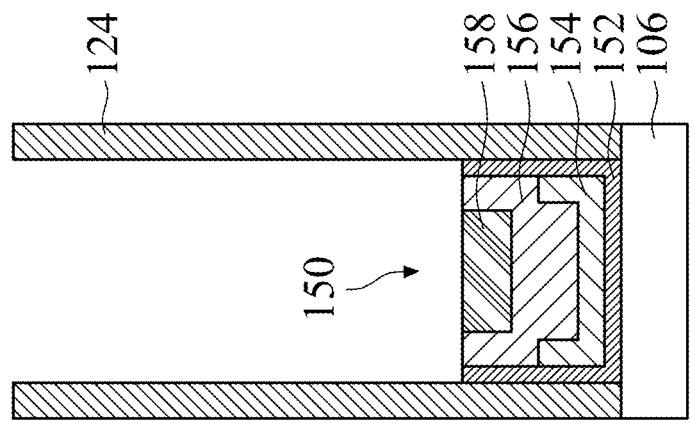
FIGS. 6A, 6B and 6C show cross-sectional representations of various stages of forming a semiconductor device structure, in accordance with some embodiments of the disclosure.
Figure 6A:
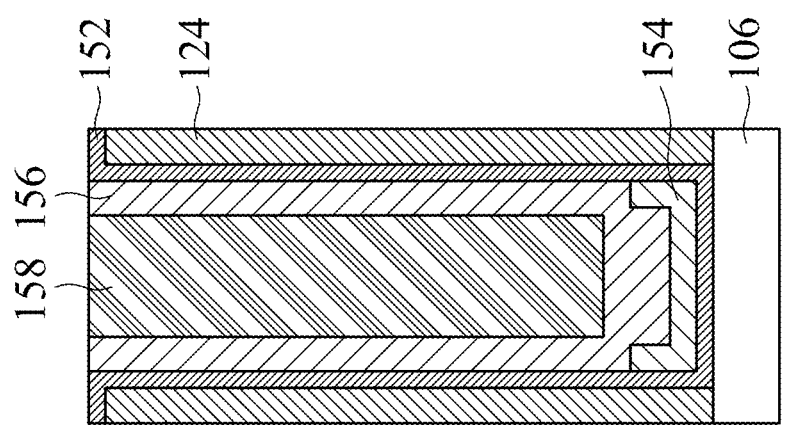
Figure 6C:
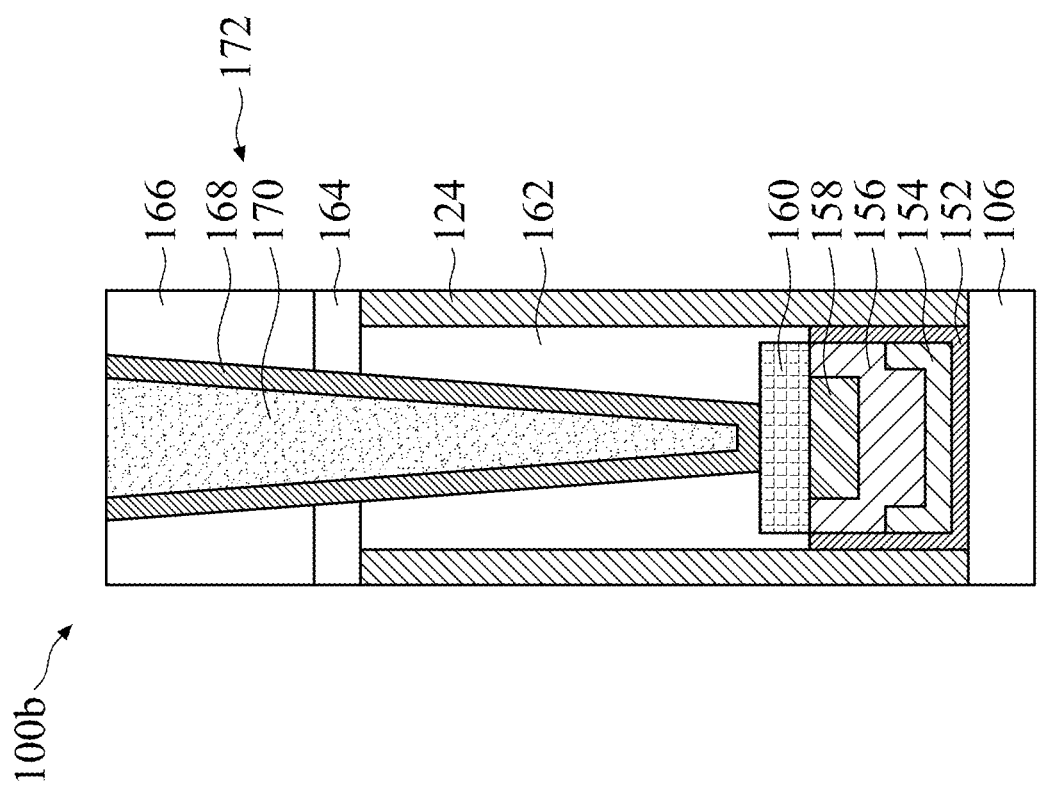

FIGS. 6A-6C show cross-sectional representations of various stages of forming a semiconductor device structure 100b, in accordance with some embodiments of the disclosure. Processes and materials used to form the semiconductor device structure 100b may be similar to, or the same as, those used to form the semiconductor device structure 100a and are not repeated herein.

FIG. 6A is similar to FIG. 5G, the different between FIG. 6A and FIG. 5G is that the second layer 156 in FIG. 6A is thicker than the second layer 156 in FIG. 5G. The second layer 156 has a bottom portion and a sidewall portion, and the bottom portion is in direct contact with the first layer 154. The bottom portion is thicker than the sidewall portion.

Next, as shown in FIG. 6B, a portion of the gat dielectric layer 152, a portion of the second layer 156 and a portion of the fill layer 158 are removed, in accordance with some embodiments of the disclosure. The fill layer 158 has a rectangular structure.

Afterwards, as shown in FIG. 6C, the gate contact structure 172 is formed on the protection layer 160. The gate contact structure 172 is electrically connected to the gate structure 150 by the protection layer 160. The protection layer 160 is separated from the first layer 154 by the second layer 156 and the fill layer 158.

FIGS. 7A-7E show cross-sectional representations of various stages of forming the semiconductor device structure 100c, in accordance with some embodiments of the disclosure. Processes and materials used to form the semiconductor device structure 100c may be similar to, or the same as, those used to form the semiconductor device structure 100a and are not repeated herein.

As shown in FIG. 7A, the gate dielectric layer 152 is formed in the trench 143, and the first layer 154 is formed over the gate dielectric layer 152, in accordance with some embodiments of the disclosure. In addition, the hard mask layer 155 is formed on a portion of the first layer 154. The hard mask layer 155 has a first portion formed in the trench 143 and a second portion over the gate dielectric layer 124.

In some embodiments, the hard mask layer 155 is made of Ti, TiN, W, TaN, WN or another applicable materials. In some embodiments, the hard mask layer 155 is formed by using a chemical vapor deposition (CVD) process, physical vapor deposition (PVD) process, atomic layer deposition (ALD) process, another applicable process, or a combination thereof.

Afterwards, as shown in FIG. 7B, the dummy layer 153 is formed in the trench 143 and over the first portion of the hard mask layer 155, in accordance with some embodiments of the disclosure. The dummy layer 153 is used to protect the underlying layers.

Figure 7D:
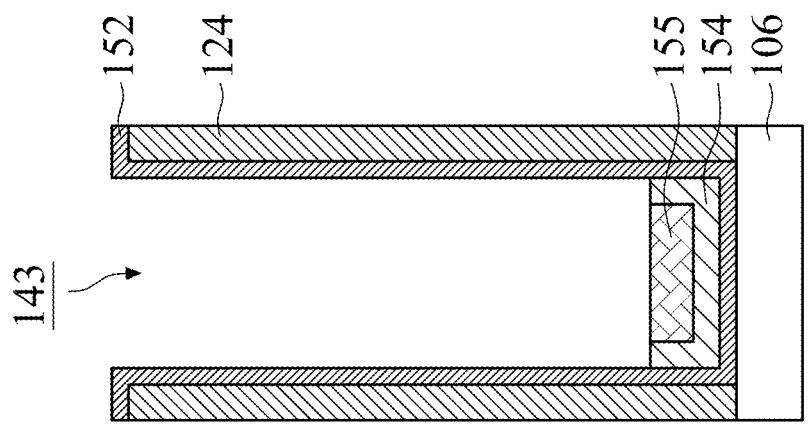
Figure 7C:
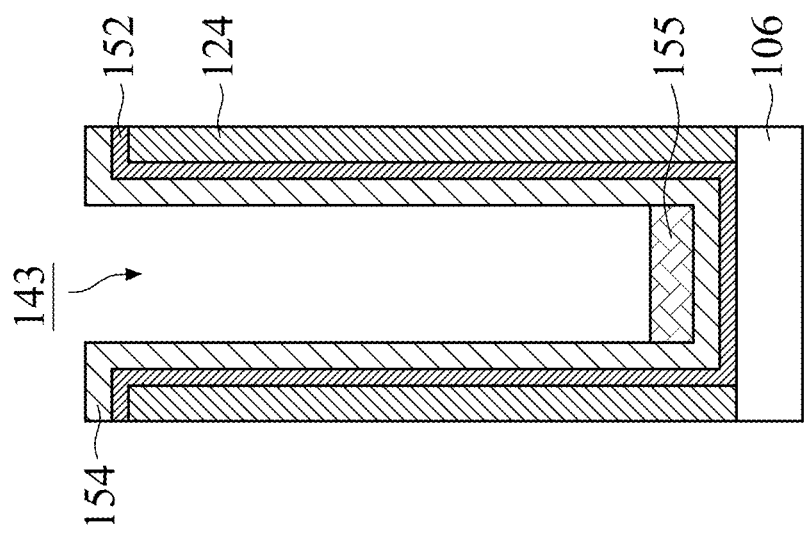

Next, as shown in FIG. 7C, a portion of the hard mask layer 155 is removed, in accordance with some embodiments of the disclosure. More specifically, the second portion of the hard mask layer 155 over the gate spacer layer 124 is removed. The first portion of the hard mask layer 155 is remaining since it is covered by the dummy layer 153. Afterwards, the dummy layer 153 is removed by an etching process, such as a wet etching process or a dry etching process.

Next, as shown in FIG. 7D, a portion of the first layer 154 is removed by using the hard mask layer 155 as a mask, in accordance with some embodiments of the disclosure. As a result, a portion of the gate dielectric layer 154 is exposed. The first layer 154 has a U-shaped structure, and the hard mask layer 155 is formed in the recessed portion of the U-shaped structure.

Figure 7E:
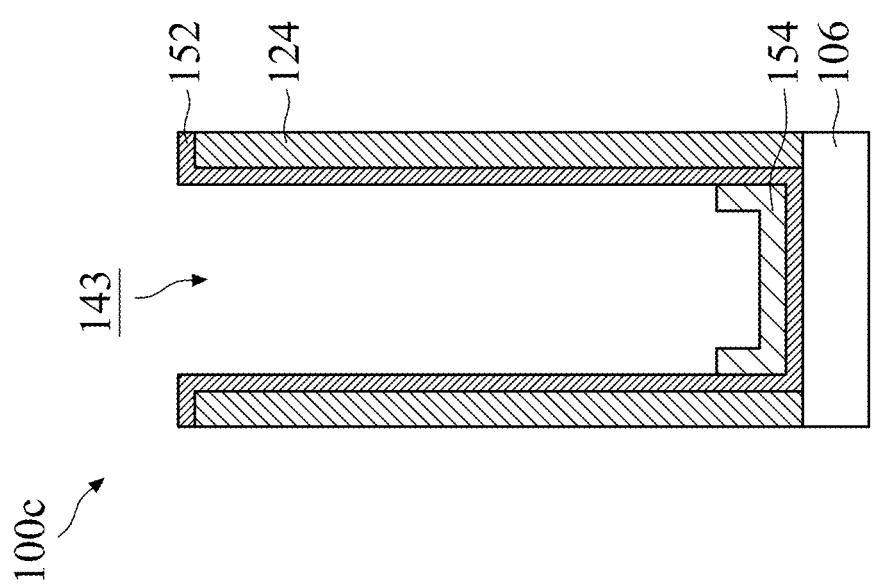

Next, as shown in FIG. 7E, the hard mask layer 155 is removed, in accordance with some embodiments of the disclosure. As a result, the first layer 154 has a U-shaped structure. Afterwards, the semiconductor device structure of FIG. 7E proceeds the processes of the FIG. 5G-5K or 6A-6C to obtain the semiconductor device structure 100c. The semiconductor device structure 100c is the same as or similar to the semiconductor device structure 100a or semiconductor device structure 100b.

FIGS. 8A-8I show cross-sectional representations of various stages of forming a semiconductor device structure 100d, in accordance with some embodiments of the disclosure. Processes and materials used to form the semiconductor device structure 100d may be similar to, or the same as, those used to form the semiconductor device structure 100a and are not repeated herein.

Figure 8A:
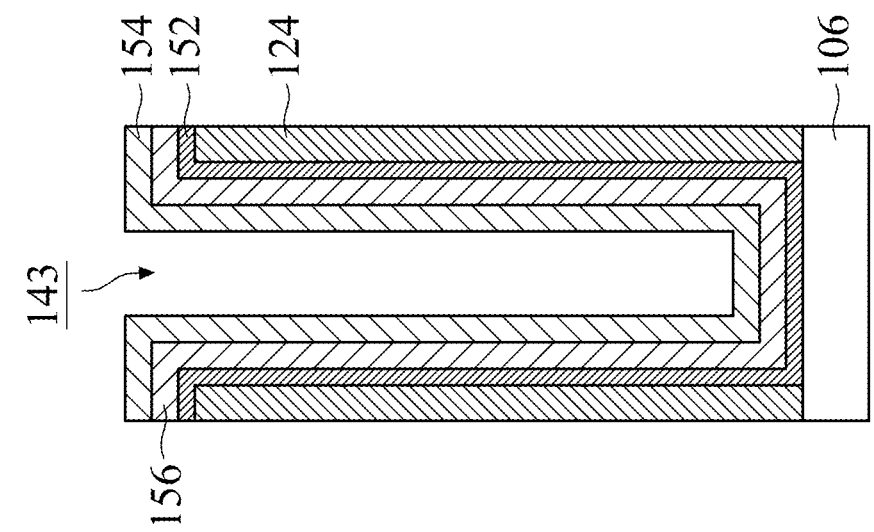

As shown in FIG. 8A, the gate dielectric layer 152, the second layer 156, and the first layer 154 are sequentially formed in the trench 143, in accordance with some embodiments of the disclosure. Note that the first layer 154 is formed after and over the second layer 156. The trench 143 is not completely filled with the first layer 154.

Afterwards, as shown in FIG. 8B, the hard mask layer 155 is formed on the first layer 154, in accordance with some embodiments of the disclosure.

Afterwards, as shown in FIG. 8C, a portion of the second layer 156 and a portion of the first layer 154 are removed by using the hard mask layer 155 as a mask, in accordance with some embodiments of the disclosure. The top surface of the first layer 154 is substantially level with the top surface of the second layer 156. The top surface of the first layer 154, the top surface of the second layer 156 are substantially level with the top surface of the hard mask layer 155.

Figure 8E:
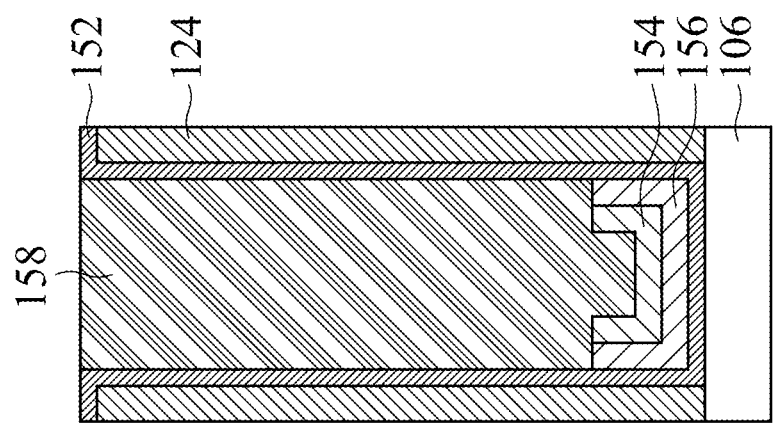
Figure 8D:
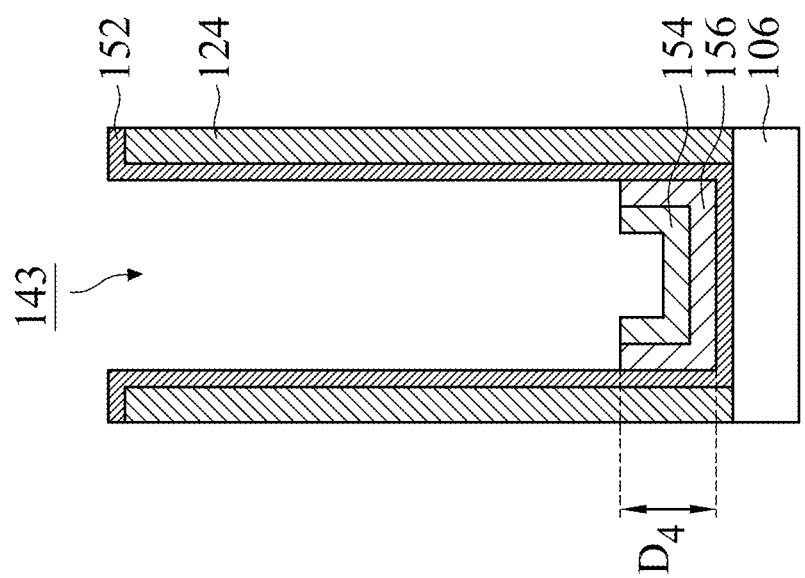

Afterwards, as shown in FIG. 8D, the hard mask layer 155 is removed, in accordance with some embodiments of the disclosure. As a result, the first layer 154 and the second layer 156 respectively have a U-shaped structure. The top surface of the first layer 154 is level with the top surface of the second layer 156. There is a fourth depth $D_4$ measured from the top surface of the second layer 156 to the bottom surface of the second layer 156. In some embodiments, the fourth depth $D_4$ is in a range from about 1 nm to about 10 nm.

Afterwards, as shown in FIG. 8E, the fill layer 158 is formed on the first layer 154 and the second layer 156, in accordance with some embodiments of the disclosure.

Figure 8G:
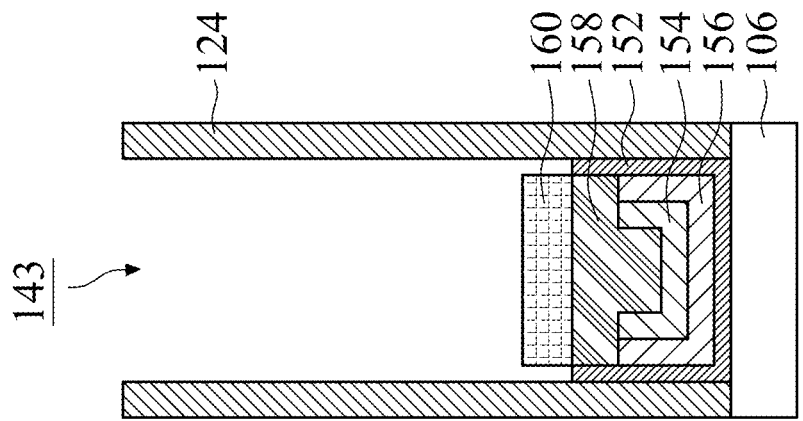
Figure 8F:
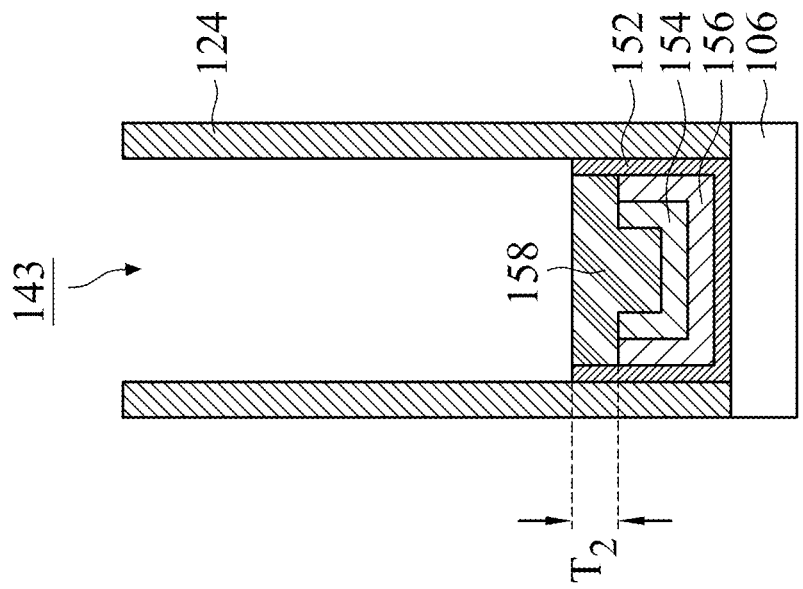

Next, as shown in FIG. 8F, a portion of the fill layer 158 and a portion of the gate dielectric layer 154 are removed, in accordance with some embodiments of the disclosure. As a result, the top surface of the gate dielectric layer 152 is lower than the top surface of the gate spacer layer 124, and the top surface of the gate dielectric layer 152 is substantially level with the top surface of the fill layer 158. In addition, the top surface of the fill layer 158 is higher than the top surface of the first layer 152 and the top surface of the second layer 156. The top surface of the first layer 154 is covered by the fill layer 158.

The fill layer 158 has a T-shaped structure with a top horizontal portion and a bottom vertical portion. The top horizontal portion has a second thickness $T_2$. In some embodiments, the second thickness $T_2$ is in a range from about 2 nm to about 20 nm.

Afterwards, as shown in FIG. 8G, the protection layer 160 is formed over the fill layer 158, in accordance with some embodiments of the disclosure. The protection layer is selectively formed on the fill layer 158, but not formed on the gate dielectric layer 152. The protection layer 160 is not in direct contact with the first layer 154. The protection layer 160 is separated from the first layer 154 by the fill layer 158.

Figure 8I:
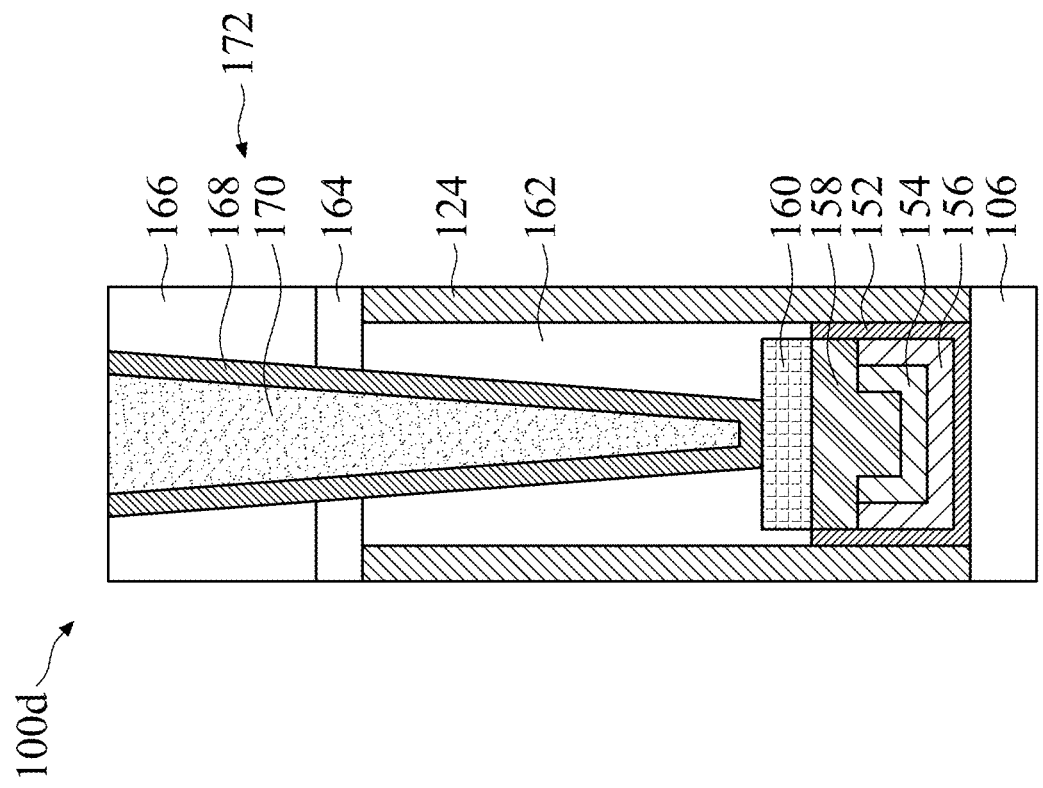
Figure 8H:
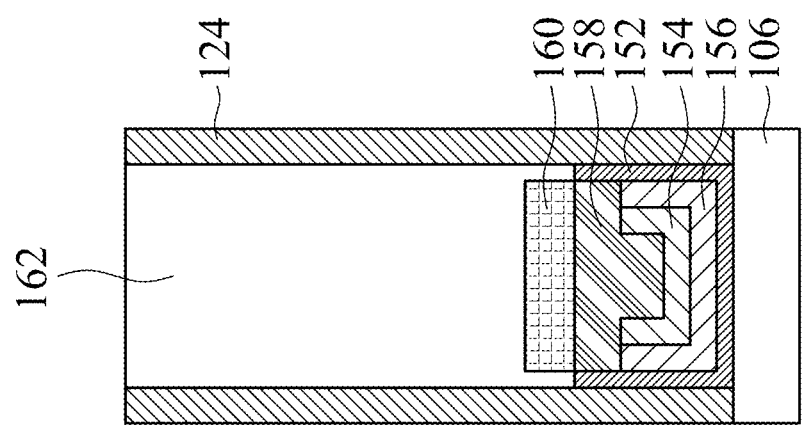

Next, as shown in FIG. 8H, the insulating layer 162 is formed on the gate dielectric layer 152 and the protection layer 160, in accordance with some embodiments of the disclosure. The insulating layer 162 has a protruding portion in direct contact with the sidewall of the protection layer 160.

Afterwards, as shown in FIG. 8I, the gate contact structure 172 is formed on the protection layer 160, in accordance with some embodiments of the disclosure. The gate contact structure 172 is electrically connected to the gate structure 150 by the protection layer 160. In some embodiments, a first width of the bottom surface of the protection layer 160 is equal to a second width of the top surface of the fill layer 158.

FIGS. 9A-9E show cross-sectional representations of various stages of forming a semiconductor device structure 100e, in accordance with some embodiments of the disclosure. Processes and materials used to form the semiconductor device structure 100d may be similar to, or the same as, those used to form the semiconductor device structure 100a and are not repeated herein.

Figure 9B:
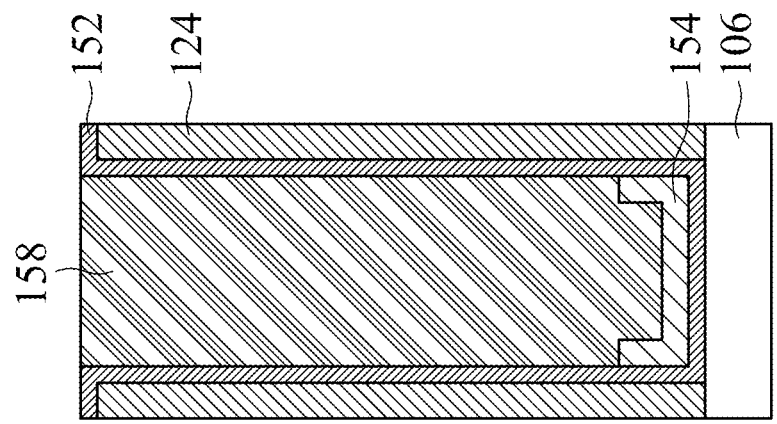
FIGS. 9A, 9B, 9C, 9D and 9E show cross-sectional representations of various stages of forming a semiconductor device structure, in accordance with some embodiments of the disclosure.
Figure 9A:
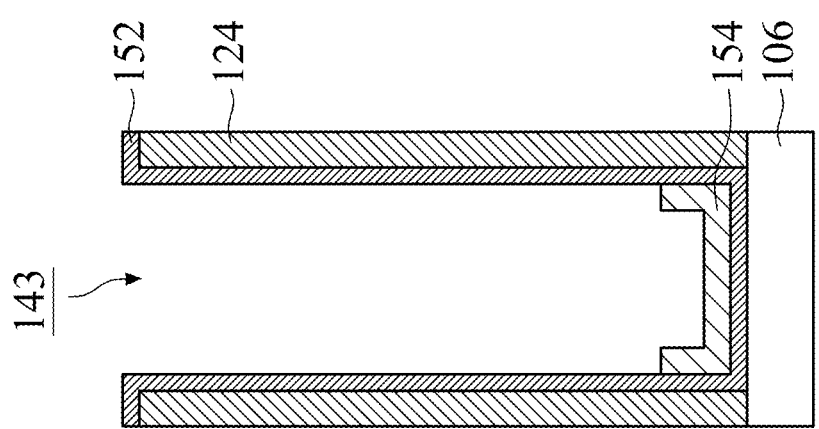

FIG. 9A is similar to FIG. 5A, the first layer 152 is formed over the gate dielectric layer 152, and the first layer 152 has a U-shaped structure.

As shown in FIG. 9B, the fill layer 158 is formed over the first layer 152 and in the trench 143, in accordance with some embodiments of the disclosure.

Figure 9C:
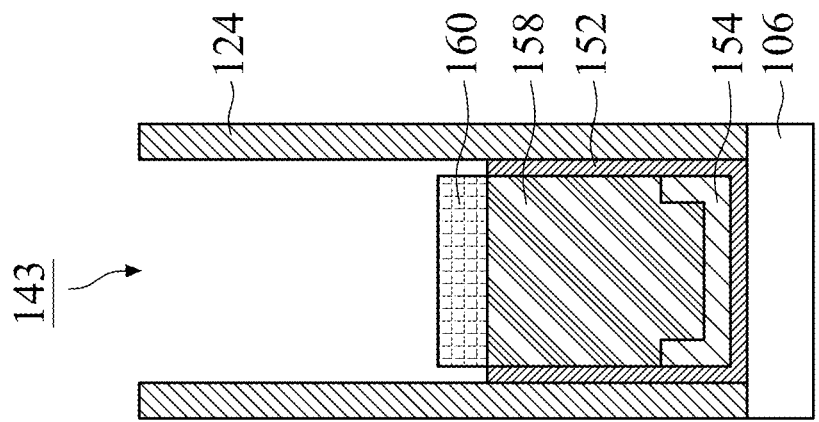

As shown in FIG. 9C, a portion of the fill layer 158 and a portion of the gate dielectric layer 152 are removed, in accordance with some embodiments of the disclosure. The portion of the fill layer 158 and the portion of the gate dielectric layer 152 are removed by an etching process, such as the dry etching process or wet etching process.

Figure 9D:
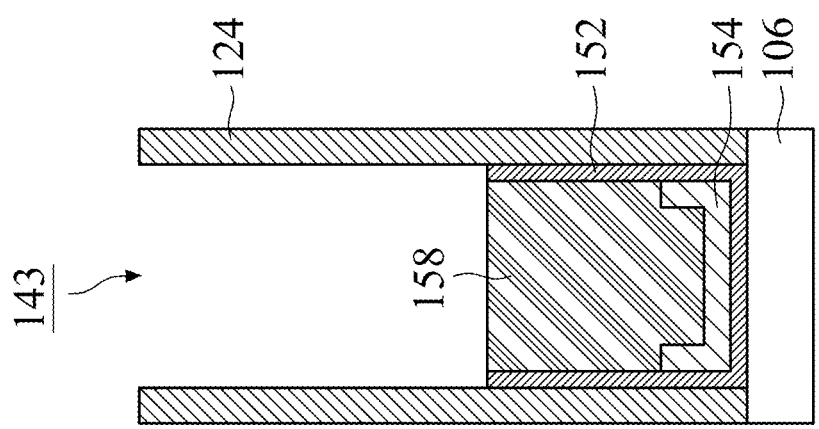

As shown in FIG. 9D, the protection layer 160 is selectively formed over the fill layer 158, in accordance with some embodiments of the disclosure. The protection layer 160 is separated from the first layer 152 by the fill layer 158. The insulating layer 162 is formed over the protection layer 160, and the insulating layer 162 is in direct contact with the gate dielectric layer 152.

Figure 9E:
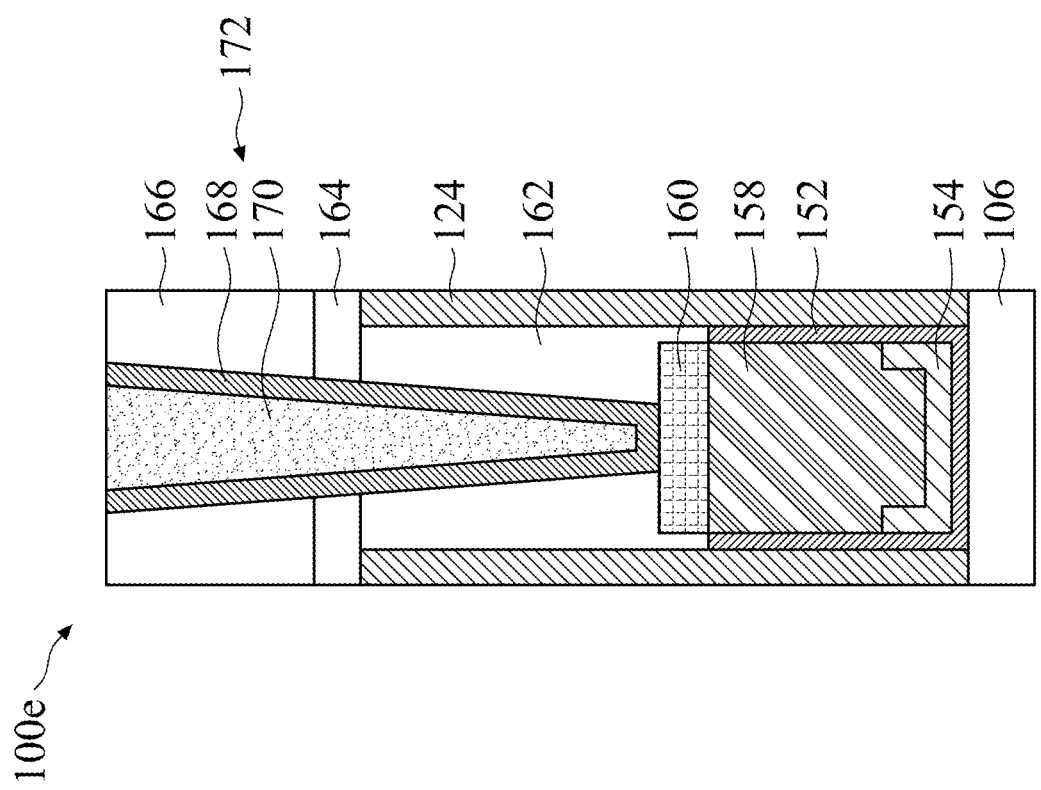

As shown in FIG. 9E, the gate contact structure 172 is formed over the gate structure 150, in accordance with some embodiments of the disclosure. There is no second layer between the first layer 152 and the fill layer 158, but the first layer 152 is not in direct contact with the protection layer 160. The fill layer 158 covers the top surface of the first layer 152, and the fill layer 158 is in direct contact with the protection layer 160. More specially, the top surface of the fill layer 158 is in direct contact with the bottom surface of the protection layer 160.

Since the protection layer 160 is selectively formed on the second layer 126 or the fill layer 158, but not on the first layer 152. The first layer 152 is covered by the second layer 156 or the fill layer 158. Therefore, the quality of the protection layer 160 can be improved. It should be noted that the protection layer 160 is in direct contact with the second layer 156 and the fill layer 158 in the semiconductor device structure 100a, 100b, 100c. The protection layer 160 is in direct contact with the fill layer 158 in the semiconductor device structure 100d, 100e.

Embodiments for forming a semiconductor device structure and method for formation the same are provided. The semiconductor structure includes a gate structure formed over a fin structure. A protection layer formed over the gate structure. The gate structure includes a first layer, a second layer and a fill layer. The first layer is separated from the protection layer by the fill layer, or by the second layer and the fill layer. The protection layer is selectively formed on the fill layer to provide a protection to prevent the gate structure from being etched or damaged. Therefore, the performance of semiconductor device structure is improved.

In some embodiments, a semiconductor device structure is provided. The semiconductor device structure includes a fin structure formed over a substrate, and a gate structure formed over the fin structure. The gate structure includes a first layer, and a fill layer over the first layer. The gate structure includes a protection layer formed over the fill layer of the gate structure, and the protection layer is separated from the first layer by the fill layer.

In some embodiments, a semiconductor device structure is provided. The semiconductor device structure includes a fin structure formed over a substrate, and the fin structure includes a plurality of nanostructures. The semiconductor device structure includes a gate structure formed over a topmost nanostructure of the nanostructures. The gate structure includes a gate dielectric layer formed over the topmost nanostructure, and a first conductive layer formed over the gate dielectric layer. A second conductive layer is formed over the gate dielectric layer, and there is a fill layer over the first conductive layer and the second conductive layer. The semiconductor device structure includes a protection layer formed over the fill layer, and an insulating layer formed over the protection layer. The insulating layer includes a protruding portion in direct contact with the gate dielectric layer.

In some embodiments, a method for forming a semiconductor device structure is provided. The method includes forming a fin structure over a substrate, and forming a dummy gate structure over the fin structure. The method includes forming a dielectric layer over the gate structure, and removing the dummy gate structure to form a trench in the dielectric layer. The method also includes forming a gate dielectric layer in the trench, and forming a first layer over the gate dielectric layer. The method further includes forming a fill layer over the first layer, and forming a protection layer over the fill layer. The protection layer is separated from the first layer by the fill layer.

In some embodiments, a semiconductor device structure is provided. The semiconductor device structure includes a fin structure formed over a substrate, and a gate structure formed over the fin structure. The gate structure includes a gate dielectric layer, a first conductive layer over the first conductive layer. The gate structure includes a fill layer over the first conductive layer. The semiconductor device structure includes a protection layer formed over the fill layer, and a top surface of the gate dielectric layer is lower than a top surface of the protection layer and higher than a top surface of the first conductive layer.

In some embodiments, a semiconductor device structure is provided. The semiconductor device structure includes a fin structure formed over a substrate, and the fin structure includes a plurality of nanostructures, and a gate structure formed over the nanostructures. The gate structure includes a gate dielectric layer formed over the nanostructures, and a first conductive layer formed over the gate dielectric layer. A topmost surface of the first conductive layer is lower than a top surface of the gate dielectric layer. The gate structure also includes a fill layer formed over the first conductive layer. The semiconductor device structure includes a protection layer formed over the fill layer.

In some embodiments, a method for forming a semiconductor device structure is provided. The method includes forming a fin structure over a substrate, and forming a dummy gate structure over the fin structure. The method also includes forming a dielectric layer over the dummy gate structure, and forming a gate spacer layer adjacent to the dummy gate structure. The method also includes removing the dummy gate structure to form a trench in the dielectric layer, and forming a gate dielectric layer in the trench. The method includes forming a first layer over the gate dielectric layer, and a top surface of the first layer is lower than a top surface of the gate spacer layer. The method includes forming a fill layer over the first layer, and forming a protection layer over the fill layer.

In some embodiments, a semiconductor device structure is provided. The semiconductor device structure includes a gate structure formed over nanostructures. The gate structure includes a gate dielectric layer, and a fill layer over the gate dielectric layer. The semiconductor device structure includes a protection layer formed over the fill layer, and a gate spacer layer formed adjacent to the gate structure. The semiconductor device structure includes an insulating layer formed over the protection layer, and the insulating layer is in direct contact with the gate spacer layer.

In some embodiments, a semiconductor device structure is provided. The semiconductor device structure includes a plurality of nanostructures, and a gate structure formed over the nanostructures. The gate structure includes a gate dielectric layer formed over the nanostructures, and a fill layer formed on the gate dielectric layer. The semiconductor device structure includes a protection layer formed over the fill layer, wherein an outer sidewall surface of the protection layer is aligned with an inner sidewall surface of the gate dielectric layer.

In some embodiments, a method for forming a semiconductor device structure is provided. The method includes forming a fin structure over a substrate, and forming a dummy gate structure over the fin structure. The method includes forming a gate spacer layer adjacent to the dummy gate structure, and forming a dielectric layer over the dummy gate structure. The method includes removing the dummy gate structure to form a trench in the dielectric layer, and forming a gate dielectric layer in the trench. The method also includes forming a fill layer over the gate dielectric layer, and forming a protection layer over the fill layer. The method also includes forming an insulating layer on the protection layer, and removing a portion of the insulating layer to form an opening and to expose the protection layer. The method also includes forming a gate contact structure in the opening, and a bottom surface of the gate contact structure is lower than a top surface of the gate spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a gate structure formed over nanostructures, wherein the gate structure comprises:
        a gate dielectric layer; and
        a metal layer over the gate dielectric layer;
    a protection layer formed over the metal layer;
    a gate spacer layer formed adjacent to the gate structure; and
    an insulating layer formed over the protection layer, wherein a portion of the insulating layer is between the protection layer and the gate spacer layer.

2. The semiconductor device structure as claimed in claim 1, further comprising:
    a gate contact structure formed over the protection layer, wherein a bottom surface of the gate contact structure is lower than a top surface of the gate spacer layer.

3. The semiconductor device structure as claimed in claim 1, wherein the portion of the insulating layer is lower than a top surface of the protection layer.

4. The semiconductor device structure as claimed in claim 1, wherein a sidewall surface of one of the nanostructures extends beyond a sidewall surface of the gate spacer layer.

5. The semiconductor device structure as claimed in claim 1, further comprising:
    an S/D structure formed adjacent to the gate structure, wherein a sidewall surface of the S/D structure is in direct contact with the gate spacer layer.

6. The semiconductor device structure as claimed in claim 5, further comprising:
    an inner spacer layer between the gate structure and the S/D structure, wherein a sidewall surface of one of the nanostructures extends beyond a sidewall surface of the inner spacer layer.

7. The semiconductor device structure as claimed in claim 1, wherein the gate structure wraps around the nanostructures.

8. A semiconductor device structure, comprising:
    a plurality of nanostructures;
    a gate structure formed over the nanostructures, wherein the gate structure comprises:
        a gate dielectric layer formed over the nanostructures;
        a metal layer formed on the gate dielectric layer;
    a gate spacer layer formed adjacent to the gate structure; and
    a protection layer formed over the metal layer, wherein a top surface of the protection layer is higher than a top surface of the gate dielectric layer and lower than a top surface of the gate spacer layer.

9. The semiconductor device structure as claimed in claim 8, wherein an outer sidewall surface of the protection layer is aligned with an outer sidewall surface of the metal layer.

10. The semiconductor device structure as claimed in claim 8, further comprising:
    a gate contact structure formed over the protection layer, wherein the gate contact structure is electrically connected to the gate structure by the protection layer.

11. The semiconductor device structure as claimed in claim 10, wherein a bottom surface of the gate contact structure is lower than a top surface of the gate spacer layer.

12. The semiconductor device structure as claimed in claim 11, wherein a top surface of the protection layer is lower than a top surface of the gate spacer layer.

13. The semiconductor device structure as claimed in claim 11, wherein a sidewall surface of one of the nanostructures extends beyond a sidewall surface of the gate spacer layer.

14. The semiconductor device structure as claimed in claim 8, further comprising:
   an S/D structure formed adjacent to the gate structure, wherein the S/D structure comprises a plurality of portions, and each of the portions are surrounded by the nanostructures.

15. The semiconductor device structure as claimed in claim 14, further comprising:
   an inner spacer layer between the gate structure and the S/D structure, wherein a sidewall surface of one of the nanostructures extends beyond a sidewall surface of the inner spacer layer.

16. A method for forming a semiconductor device structure, comprising:
   forming a fin structure over a substrate;
   forming a dummy gate structure over the fin structure;
   forming a gate spacer layer adjacent to the dummy gate structure;
   forming a dielectric layer over the dummy gate structure;
   removing the dummy gate structure to form a trench in the dielectric layer;
   forming a gate dielectric layer in the trench;
   forming a fill layer over the gate dielectric layer;
   forming a protection layer over the fill layer;
   forming an insulating layer on the protection layer, wherein a portion of the insulating layer is lower than a top surface of the protection layer;
   removing a portion of the insulating layer to form an opening and to expose the protection layer; and
   forming a gate contact structure in the opening, wherein a bottom surface of the gate contact structure is lower than a top surface of the gate spacer layer.

17. The method for forming the semiconductor device structure as claimed in claim 16, further comprising:
   forming a first layer over the gate dielectric layer;
   forming a second layer over the first layer; and
   forming the fill layer over the second layer, wherein the fill layer is separate from the first layer by the second layer.

18. The method for forming the semiconductor device structure as claimed in claim 16, wherein the fin structure comprises a plurality of first semiconductor material layers and a plurality of second semiconductor material layers alternatively stacked, and the method comprises: removing a portion of the first semiconductor material layers to form a plurality of S/D trenches.

19. The method for forming the semiconductor device structure as claimed in claim 18, further comprising:
   forming an S/D structure in the S/D trenches, wherein the S/D structure comprises a plurality of portions which are surrounded by the second semiconductor material layers.

20. The method for forming the semiconductor device structure as claimed in claim 16, further comprising:
   forming an etching stop layer on the insulating layer;
   forming a dielectric layer on the etching stop layer; and
   removing a portion of the dielectric layer and a portion of the etching stop layer to form the opening.

* * * * *